United States Patent
Hamano et al.

(10) Patent No.: US 7,606,083 B2
(45) Date of Patent: Oct. 20, 2009

(54) SEMICONDUCTOR MEMORY DEVICE WITH A NOISE FILTER AND METHOD OF CONTROLLING THE SAME

(75) Inventors: Tomoyuki Hamano, Yokohama (JP); Shigefumi Ishiguro, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 196 days.

(21) Appl. No.: 11/865,483

(22) Filed: Oct. 1, 2007

(65) Prior Publication Data

US 2008/0253198 A1  Oct. 16, 2008

(30) Foreign Application Priority Data

Oct. 2, 2006  (JP) .............................. 2006-271145

(51) Int. Cl.
*G11C 7/00* (2006.01)

(52) U.S. Cl. .............................. 365/189.05; 365/189.12

(58) Field of Classification Search ............ 365/189.05, 365/189.12
See application file for complete search history.

(56) References Cited

U.S. PATENT DOCUMENTS

| 5,107,523 | A | 4/1992 | Heaney et al. |
| 5,289,060 | A | 2/1994 | Elnashar et al. |
| 6,025,744 | A | 2/2000 | Bertolet et al. |
| 6,396,758 | B2 * | 5/2002 | Ikeda et al. ................. 365/222 |
| 6,542,408 | B2 * | 4/2003 | Roohparvar ........... 365/185.18 |
| 6,714,479 | B2 * | 3/2004 | Takahashi et al. ......... 365/233.5 |
| 6,809,989 | B2 * | 10/2004 | Takahashi et al. ...... 365/230.08 |

FOREIGN PATENT DOCUMENTS

JP  7-29377  1/1995

* cited by examiner

*Primary Examiner*—Son Dinh
(74) *Attorney, Agent, or Firm*—Oblon, Spivak, McClelland, Maier & Neustadt, L.L.P.

(57) ABSTRACT

A semiconductor memory device includes a memory cell array, an output buffer circuit and an input buffer circuit. The memory cell array includes a plurality of memory cells holding data. The output buffer circuit outputs data read from the memory cells. The input buffer circuit receives an address signal for the memory cells and includes a noise filter to remove noise. The filter length of the noise filter is variable according to the output capability of the data in the output buffer circuit.

18 Claims, 27 Drawing Sheets

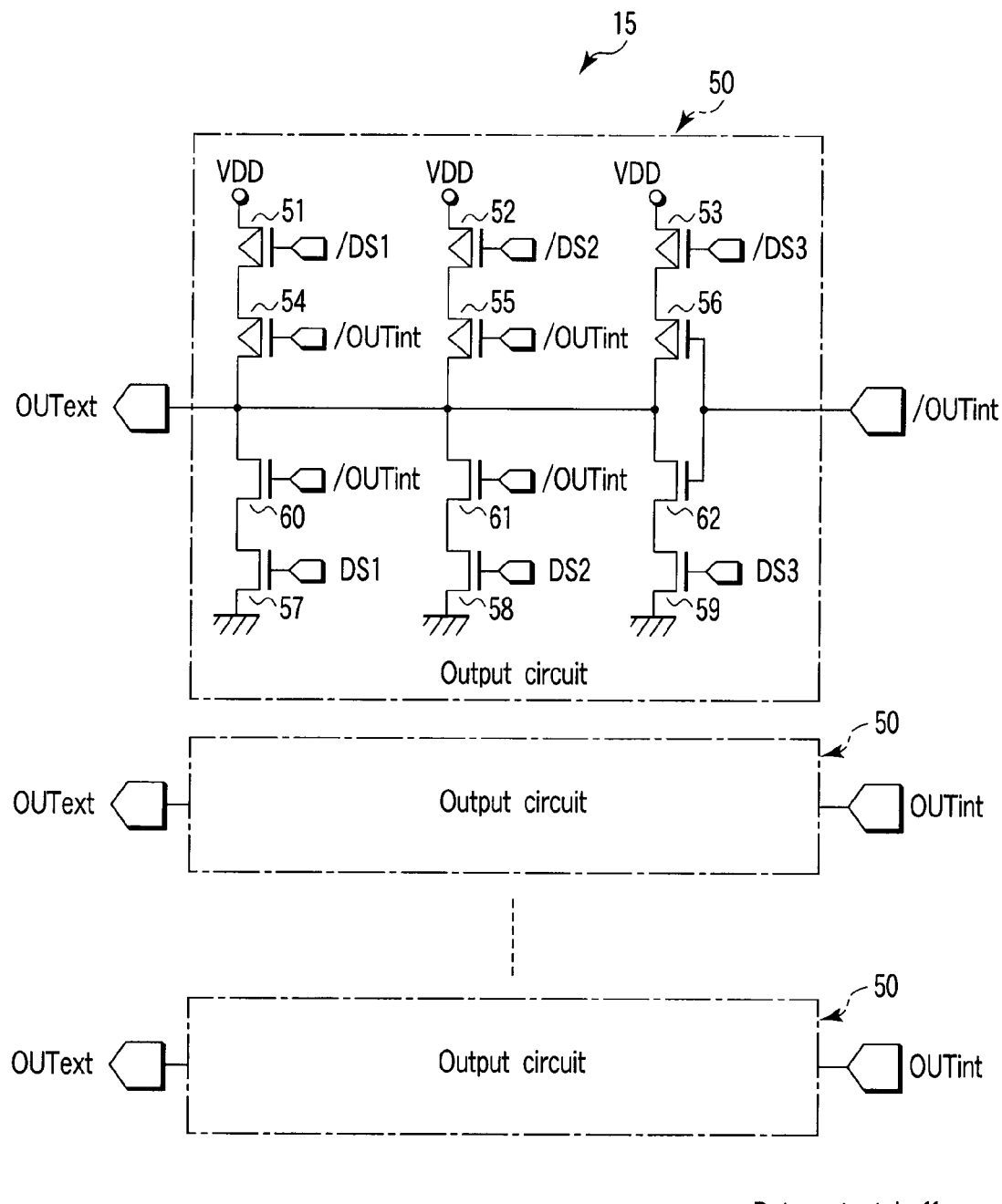
F I G. 3

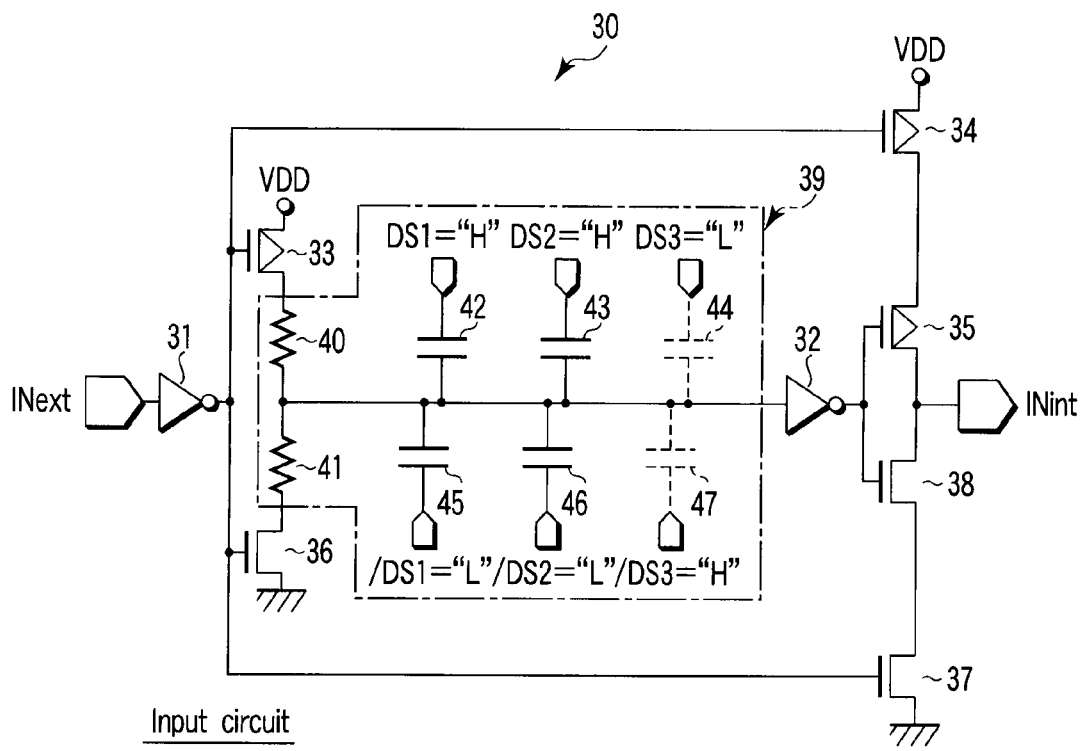
F I G. 8
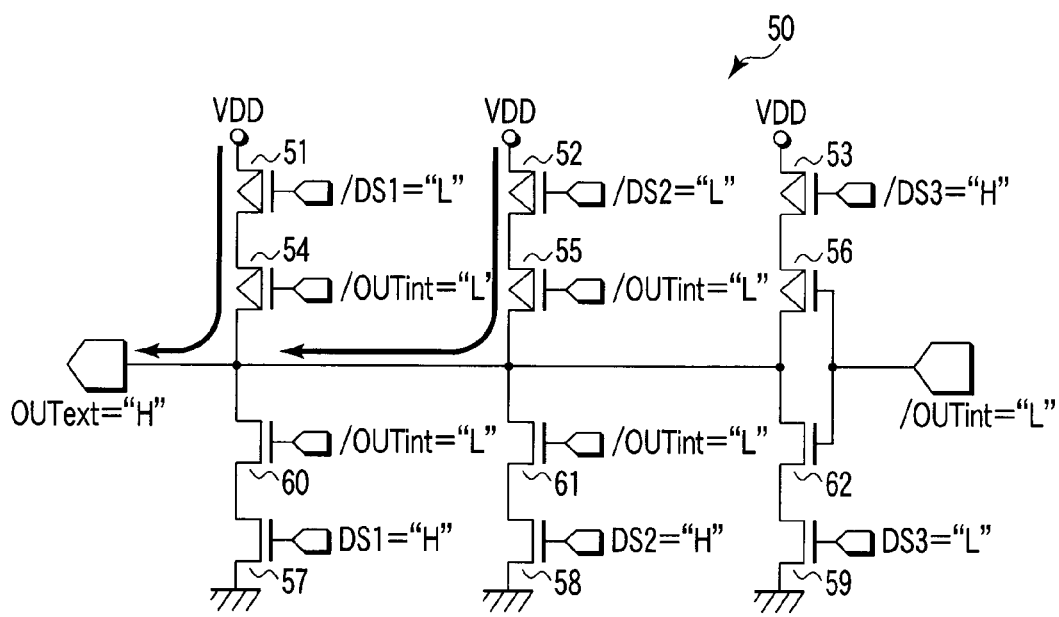
F I G. 9

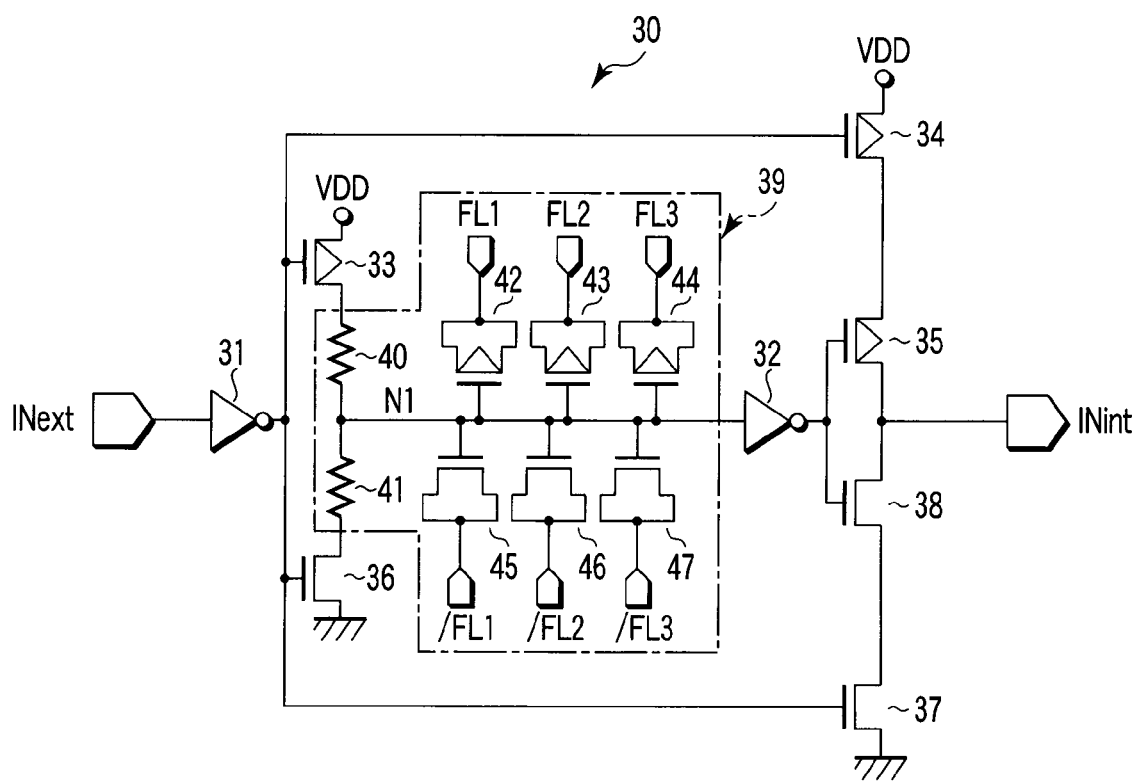
F I G. 16

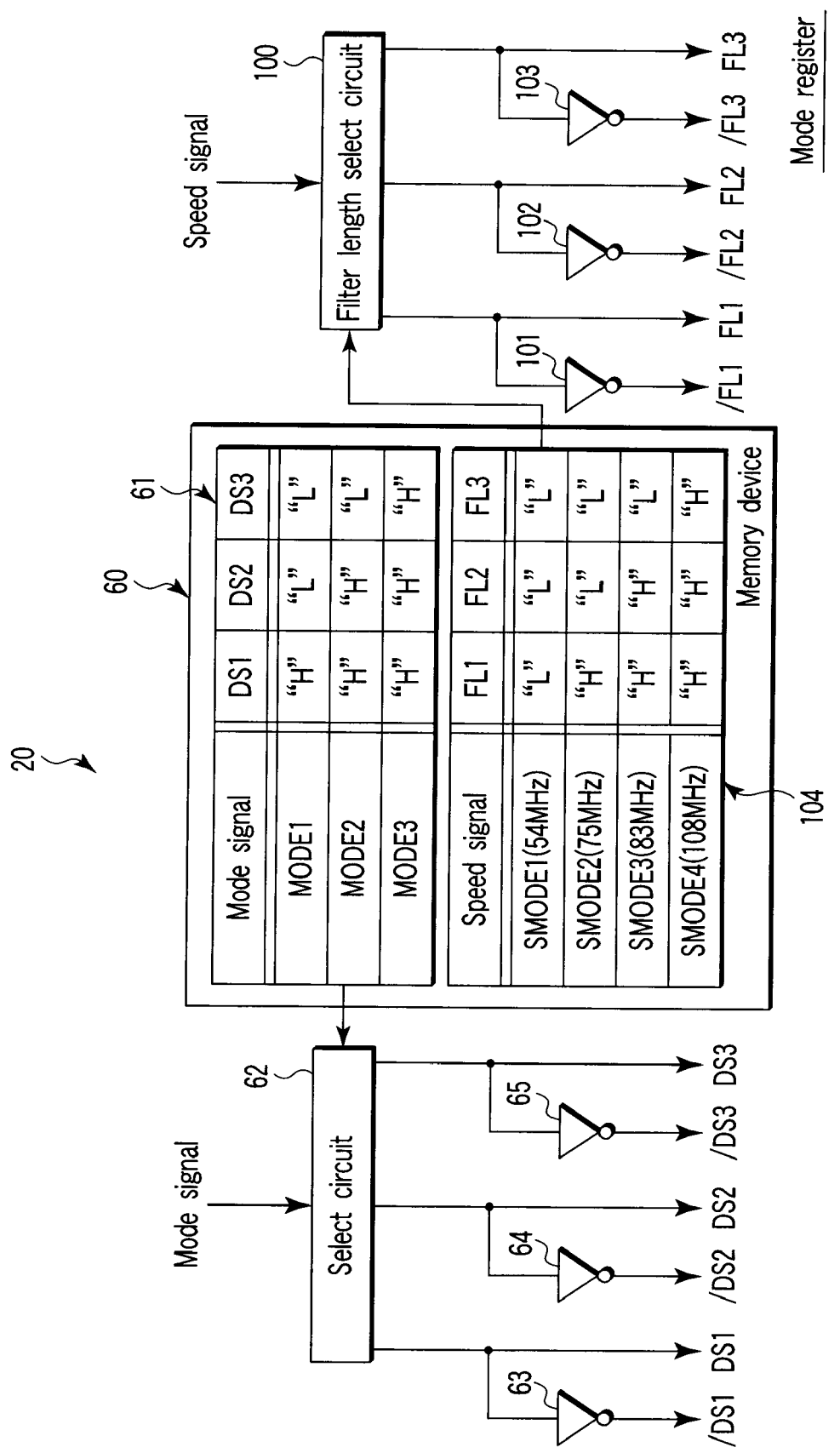
F I G. 28

Input circuit

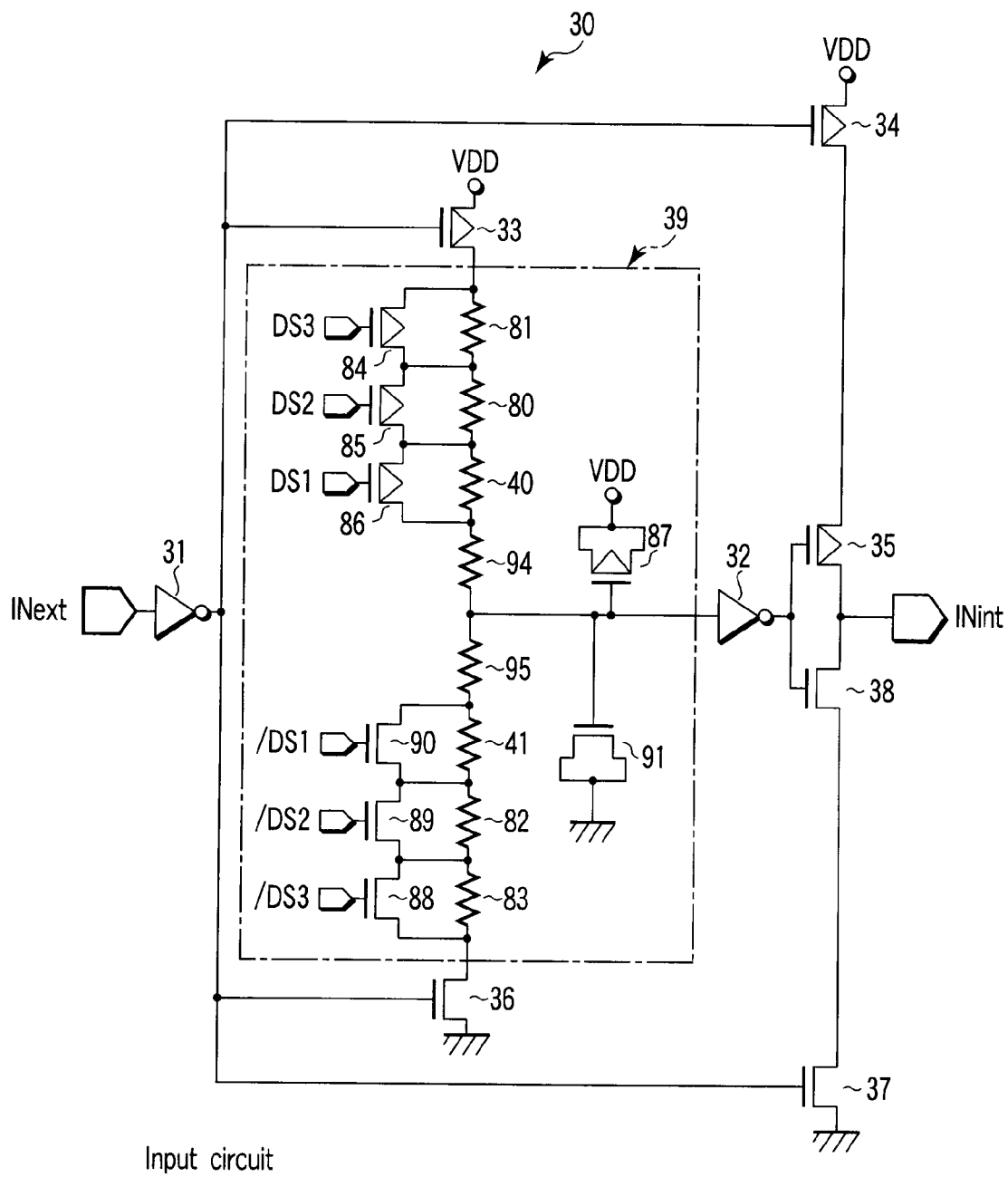
F I G. 39

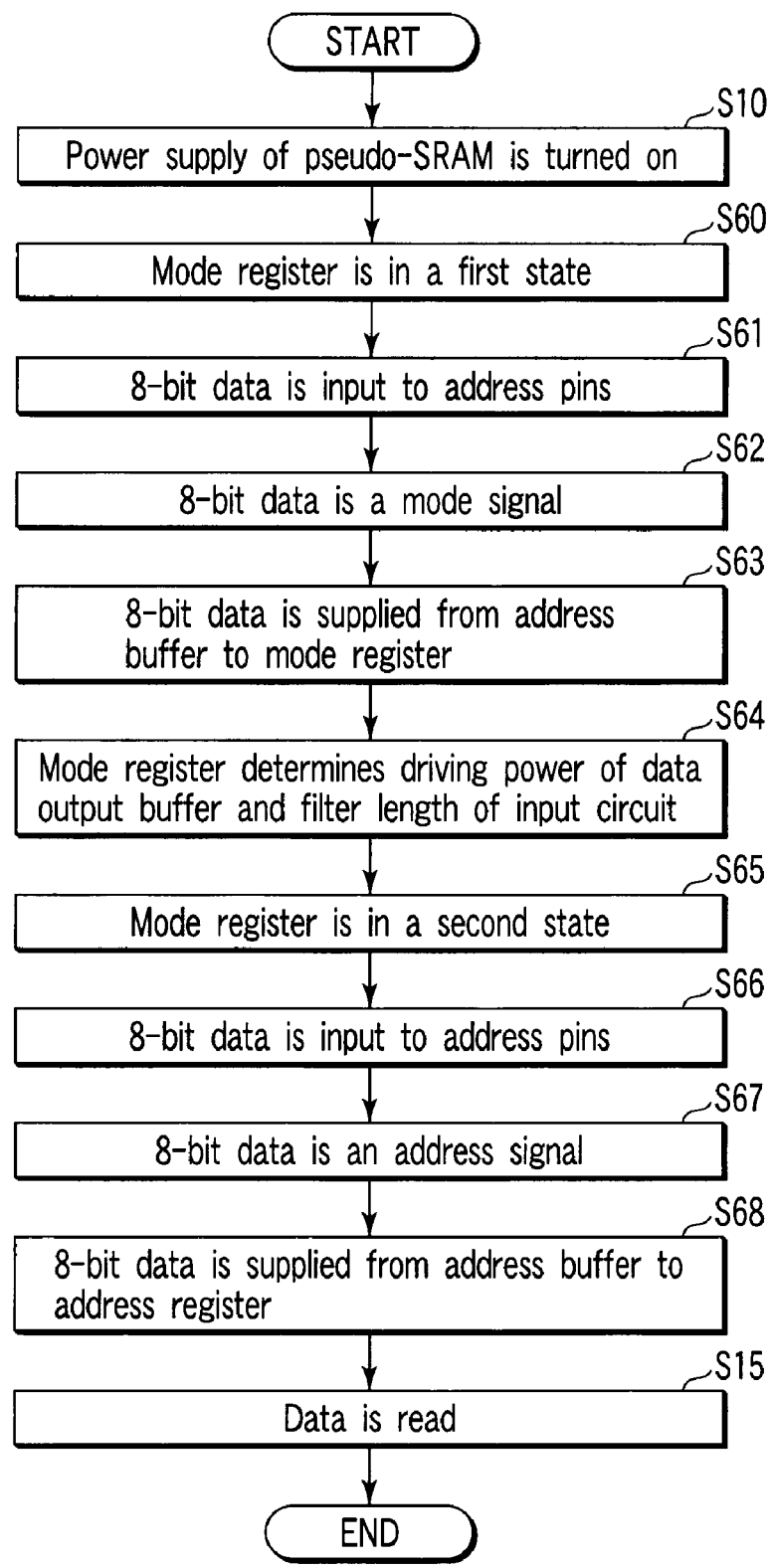
F I G. 42

SEMICONDUCTOR MEMORY DEVICE WITH A NOISE FILTER AND METHOD OF CONTROLLING THE SAME

CROSS-REFERENCE TO RELATED APPLICATIONS

This application is based upon and claims the benefit of priority from prior Japanese Patent Application No. 2006-271145, filed Oct. 2, 2006, the entire contents of which are incorporated herein by reference.

BACKGROUND OF THE INVENTION

1. Field of the Invention

This invention relates to a semiconductor memory device and a method of controlling the semiconductor memory device. For example, this invention relates to a method of controlling the filter length of a noise filter for removing noise.

2. Description of the Related Art

In recent years, semiconductor memory devices have been made faster remarkably and have made surprising progress in multi-bit design. With the faster operation and multi-bit design, a noise problem has occurred notably. A method of coping with the noise problem has been disclosed in, for example, Jpn. Pat. Appln. KOKAI Publication No. H07-029377. With the method, a noise filter is provided in an input circuit.

The magnitude of noise is not always constant. Accordingly, with a conventional configuration, the noise removing capability of the noise filter was sometimes insufficient. Moreover, increasing the filter length of the noise filter to improve the noise removing capability makes the filter length unnecessarily great, which causes the problem of decreasing the operating speed.

BRIEF SUMMARY OF THE INVENTION

A semiconductor memory device according to an aspect of the present invention includes:

a memory cell array which includes a plurality of memory cells holding data;

an output buffer circuit which outputs data read from the memory cells; and an input buffer circuit which receives an address signal for the memory cells and includes a noise filter to remove noise, the filter length of the noise filter being variable according to the output capability of the data in the output buffer circuit.

A method of controlling a semiconductor memory device according to an aspect of the present invention includes:

accepting a first control signal input to the semiconductor memory device after the power supply of the semiconductor memory device has been turned on;

referring to a table which holds the relationship between the first control signal and the current driving power of a data output circuit and generating a second control signal which controls the data output circuit so as to produce the current driving power corresponding to the first control signal accepted;

determining the current driving power of the data output circuit according to the second control signal; and on the basis of the second control signal, determining the filter length of a noise filter in an input buffer accepting an external input signal in such a manner that the filter length is set greater as the current driving power becomes higher.

BRIEF DESCRIPTION OF THE SEVERAL VIEWS OF THE DRAWING

FIG. 3 is a circuit diagram of a data output buffer included in the PSRAM of the first embodiment;

FIG. 8 is a circuit diagram of an input circuit included in the PSRAM of the first embodiment, showing a case where MODE2 has been input;

FIG. 9 is a circuit diagram of an output circuit included in the PSRAM of the first embodiment, showing a case where MODE2 has been input;

FIG. 16 is a circuit diagram of an input circuit included in a PSRAM according to a second embodiment of the invention;

FIG. 28 is a circuit diagram of a mode register according to a fifth embodiment of the invention;

FIG. 39 is a circuit diagram of an input circuit included in a PSRAM according to a modification of the eighth embodiment;

FIG. 42 is a flowchart to help explain the flow of processing on the basis of the signal input to the address buffer in the PSRAM according to the first to eighth embodiments of the invention.

DETAILED DESCRIPTION OF THE INVENTION

First Embodiment

Figure 1:
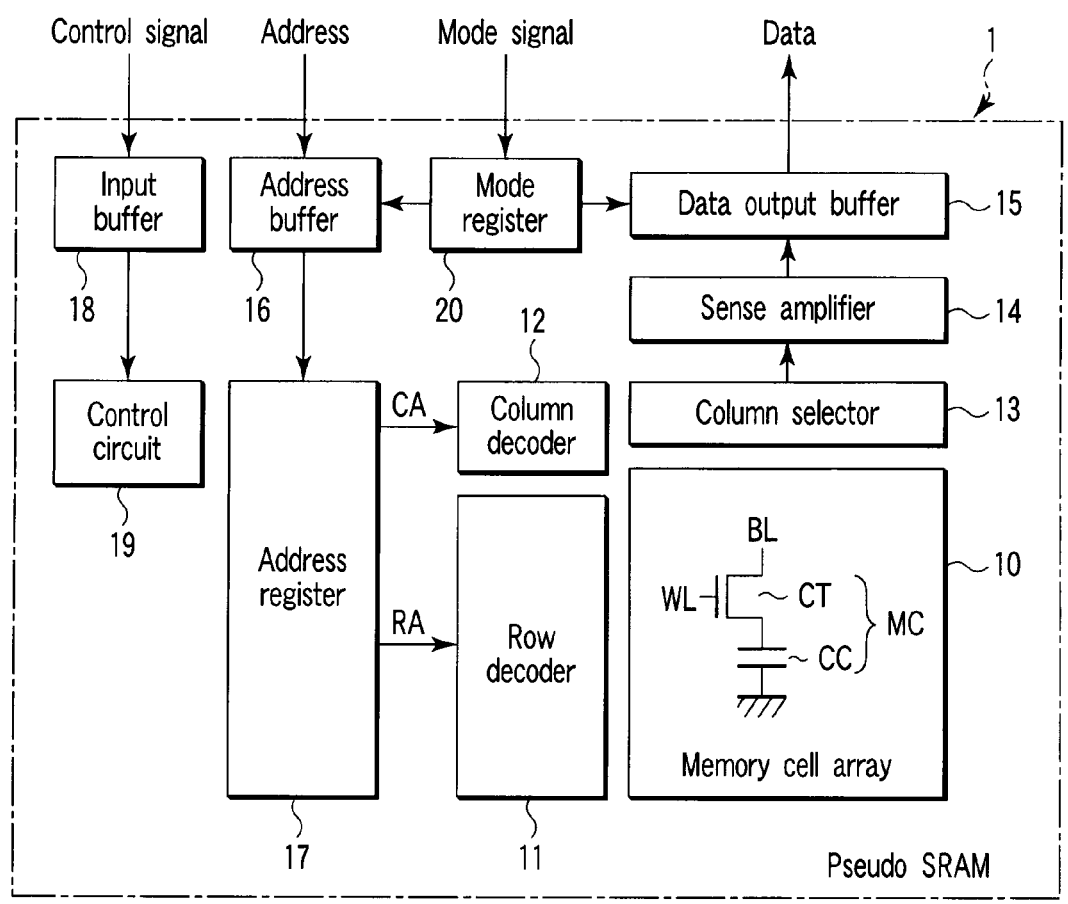
FIG. 1 is a block diagram of a PSRAM according to a first embodiment of the invention.

A semiconductor memory device according to a first embodiment of the invention will be explained. FIG. 1 is a block diagram of a pseudo-SRAM (hereinafter, referred to as a PSRAM) according to the first embodiment.

As shown in FIG. 1, the PSRAM 1 includes a memory cell array 10, a row decoder 11, a column decoder 12, a column selector 13, a sense amplifier 14, a data output buffer 15, an address buffer 16, an address register 17, an input buffer 18, a control circuit 19, and a mode register 20.

The memory cell array 10 includes a plurality of DRAM-type memory cells arranged in a matrix. As shown in FIG. 1, each of the memory cells MC includes a cell transistor CT and a cell capacitor CC. One electrode of the cell capacitor CC is grounded and the other electrode of the cell capacitor is connected to the source of the cell transistor CT. The cell transistor CT has its gate connected to a word line WL and its drain connected to a bit line BL. In the memory cell array 10, the memory cells MC in the same column are connected commonly to the same bit line BL and the memory cells MC in the same row are connected commonly to the same word line WL.

The row decoder 11 selects the row direction of the memory cell array 10. That is, the row decoder 11 selects a word line. When data is read or written, the row decoder 11 applies a voltage to the selected word line WL. The column decoder 12 selects the column direction of the memory cell array 10. The column selector 13 selects a bit line on the basis of the selecting operation of the column decoder 12 and, in a read operation, connects the selected bit line to the sense amplifier 14. The sense amplifier 14 senses the data read from the memory cell MC selected by the row decoder 11 and column decoder 12 and amplifies the data. The data output buffer 15 outputs the data containing a plurality of bits amplified by the sense amplifier 14.

The address buffer 16 receives an external address signal and outputs the address signal to the address register 17. According to the address given from the address buffer 16, the address register 17 outputs a column address CA to the column decoder 12 and a row address RA to the row decoder 11. The column decoder 12 selects a bit line on the basis of the column address CA. The row decoder 11 selects a word line on the basis of the row address RA.

Receiving an external control signal, the input buffer 18 outputs the control signal to the control circuit 19. The control signal is, for example, a chip enable signal, a write enable signal, or an output enable signal. The chip enable signal is a signal for enabling the PSRAM 1. The write enable signal is a signal for enabling the PSRAM 1 to be written into. The output enable signal is a signal for enabling the PSRAM 1 to output data. The mode register 20 receives an external mode signal. According to the mode signal, the mode register 20 controls the address buffer 16 and data output buffer 15.

Figure 2:
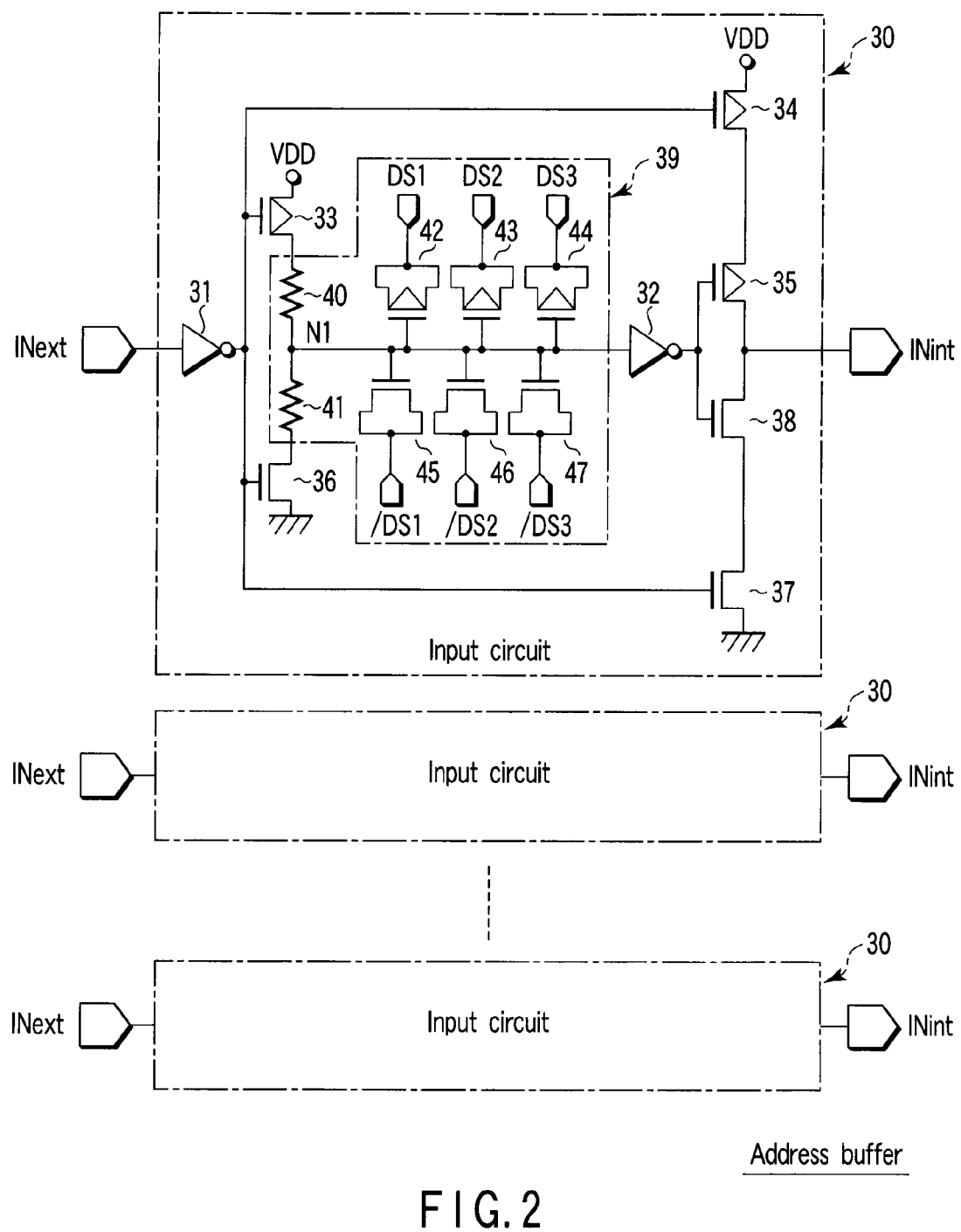
FIG. 2 is a circuit diagram of an address buffer included in the PSRAM of the first embodiment.

Hereinafter, the data output buffer 15, address buffer 16, and mode register 20 will be explained in detail. First, using FIG. 2, the address buffer 16 will be explained. FIG. 2 is a circuit diagram of the address buffer 16.

As shown in FIG. 2, the address buffer 16 includes, for example, eight input circuits 30. The number of input circuits 30 is illustrative only. For example, as many input circuits as the number of bits in the address signal input to the address buffer 16 may be provided. That is, 16 or 32 input circuits may be provided. Each bit in the address signal is input to each of the input circuits 30. Each of the input circuits 30 includes inverters 21, 22, p-channel MOS transistors 33 to 35, n-channel MOS transistors 36 to 38, and a noise filter 39. The noise filter 39 includes resistance element 40, 41, p-channel MOS transistors 42 to 44, and n-channel MOS transistors 45 to 47.

An input signal INext to the input circuit 30 is input to the input end of inverter 31, which inverts the input signal INext. The input signal INext is a 1 bit in the aforementioned address signal. MOS transistor 33 has its source applied with a power supply voltage VDD, its gate connected to the output end of inverter 31, and its drain connected to one end of resistance element 40. MOS transistor 33 is supplied with VDD as a back gate bias. MOS transistor 36 has its source grounded, its gate connected to the output end of inverter 31, and its drain connected to one end of resistance element 41. MOS transistor 36 is supplied with the ground potential as a back gate bias.

The other end of resistance element 40 is connected to the other end of resistance element 41. The input end of inverter 32 is connected to a junction node of the other end of resistance element 40 and the other end of resistance element 41. Hereinafter, the node between the input end of inverter 32 and the junction node of resistance elements 40, 41 is referred to as node N1. Inverter 32 inverts the signal at node N1.

MOS transistor 34 has its source applied with the power supply voltage VDD, its gate connected to the output end of inverter 31, and its drain connected to the source of MOS transistor 35. MOS transistor 34 is supplied with VDD as a back gate bias. MOS transistor 35 has its gate connected to the output end of inverter 32. The potential at the drain of MOS transistor 35 is the output signal INint of the input circuit 30. MOS transistor 35 is supplied with VDD as a back gate bias. MOS transistor 37 has its source grounded, its gate connected to the output end of inverter 31, and its drain connected to the source of MOS transistor 38. MOS transistor 37 is supplied with the ground potential as a back gate bias. MOS transistor 38 has its gate connected to the output end of inverter 32 and its drain connected to the drain of MOS transistor 35. MOS transistor 38 is supplied with the ground potential as a back gate bias.

MOS transistors 42 to 44 have their gates connected to node N1 and their source and drain connected to each other to form a common junction node. Drive control signals DS1 to DS3 are input to the common junction nodes of MOS transistors 42 to 44, respectively. MOS transistors 42 to 44 are supplied with VDD as a back gate bias. MOS transistors 45 to 47 have their gates connected to node N1 and their source and drain connected to each other to form a common junction node. Drive control signals /DS1 to /DS3 are input to the common junction nodes of MOS transistors 45 to 47, respectively. MOS transistors 45 to 47 are supplied with the ground potential as a back gate bias. MOS transistors 42 to 47 each function as a capacitor element according to drive control signals DS1 to DS3, /DS1 to /DS3.

In the above configuration, resistance elements 40, 41, and MOS transistors 42 to 47 form an RC circuit and function as a noise filter for delaying an input signal INext (address signal).

Next, using FIG. 3, the configuration of the data output buffer 15 will be explained. FIG. 3 is a circuit diagram of the data output buffer 15.

As shown in FIG. 3, the data output buffer 15 includes, for example, 32 output circuits 50. The number of output circuits 50 is illustrative only. For example, as many output circuits as the maximum number of bits that can be output at a time may be provided. That is, 64 or 128 output circuits may be provided. To each of the output circuits 50, each bit in the data read from the sense amplifier 14 is input. Each of the output circuits 50 includes p-channel MOS transistors 51 to 56 and n-channel MOS transistors 57 to 62.

MOS transistors 51 to 53 have their sources applied with the power supply voltage VDD. Drive control signals /DS1 to /DS3 are input to the gates of MOS transistors 51 to 53, respectively. The drains of MOS transistors 51 to 53 are connected to the sources of MOS transistors 54 to 56, respectively. VDD is supplied as a back gate bias to MOS transistors 51 to 53. Inverted input signal /OUTint to the output circuit 50 is input to the gates of MOS transistors 54 to 56. The drains of MOS transistors 54 to 56 are connected to the drains of MOS transistors 60 to 62, respectively. VDD is supplied as a back gate bias to MOS transistors 54 to 56. The inverted input signal /OUTint is a signal obtained by inverting one bit in the data read from the sense amplifier 14.

The sources of MOS transistors 57 to 59 are grounded. Drive control signal DS1 to DS3 are input to the gates of MOS transistors 57 to 59, respectively. The drains of MOS transistors 57 to 59 are connected to the sources of MOS transistors 60 to 62, respectively. The ground potential is supplied as a back gate bias to MOS transistors 57 to 59. The inverted input signal /OUTint is input to the gates of MOS transistors 60 to 62. The ground potential is supplied as a back gate bias to MOS transistors 60 to 62.

In the above configuration, the potential of the junction node of the drains of MOS transistors 54 to 56 and the drains of MOS transistors 60 to 62 is the output signal OUText of the output circuit 50.

Figure 4:
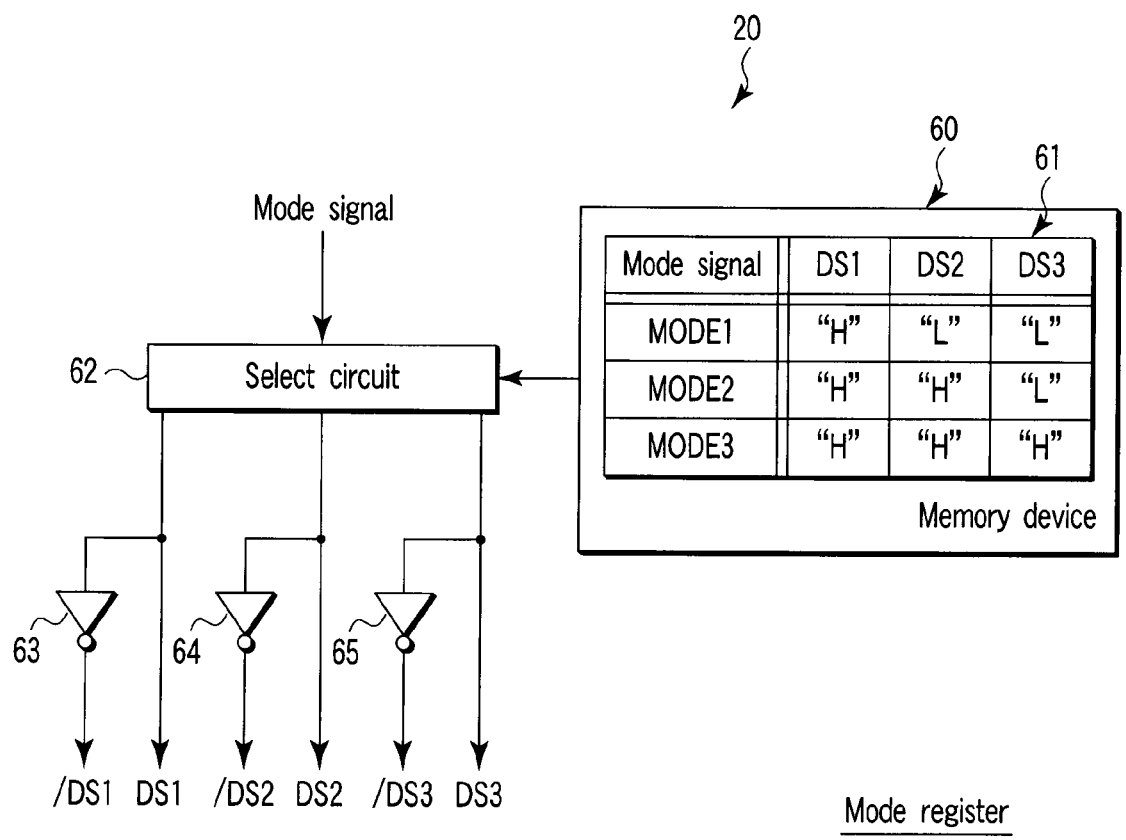
FIG. 4 is a circuit diagram of a mode register included in the PSRAM of the first embodiment.

Next, using FIG. 4, the configuration of the mode register 20 will be explained. FIG. 4 is a block diagram of the mode register 20.

As shown in FIG. 4, the mode register 20 includes a memory device 60, a select circuit 62, and inverters 63 to 65. The memory device 60 is a semiconductor memory, such as a DRAM or a flash memory, and holds a drive control signal table 61. The drive control signal table 61 is written into the memory device 60 in advance in manufacturing the PSRAM 1. In the drive control signal table 61, control information about drive control signals DS1 to DS3 according to the mode signal externally input has been stored. In the example of FIG. 4, three signals MODE1 to MODE3 are prepared for mode signals. In the drive control signal table, the following information is stored: when MODE1 has been input as a mode signal, drive control signal DS1 is made high, and DS2 and DS3 are made low; when MODE2 has been input as a mode signal, drive control signals DS1 and DS2 are made high, and DS3 is made low; and when MODE3 has been input as a mode signal, drive control signals DS1 to DS3 are all made high. The details of the mode signals will be described later.

According to the externally input mode signal, the select circuit 62 reads information about drive control signals DS1 to DS3 from the drive control signal table 61 in the memory device 60. Then, according to the read information, the select circuit 62 generates drive control signals DS1 to DS3. Inverters 63 to 65 invert drive control signals DS1 to DS3, respectively, thereby generating drive control signals /DS1 to /DS3.

Figure 5:
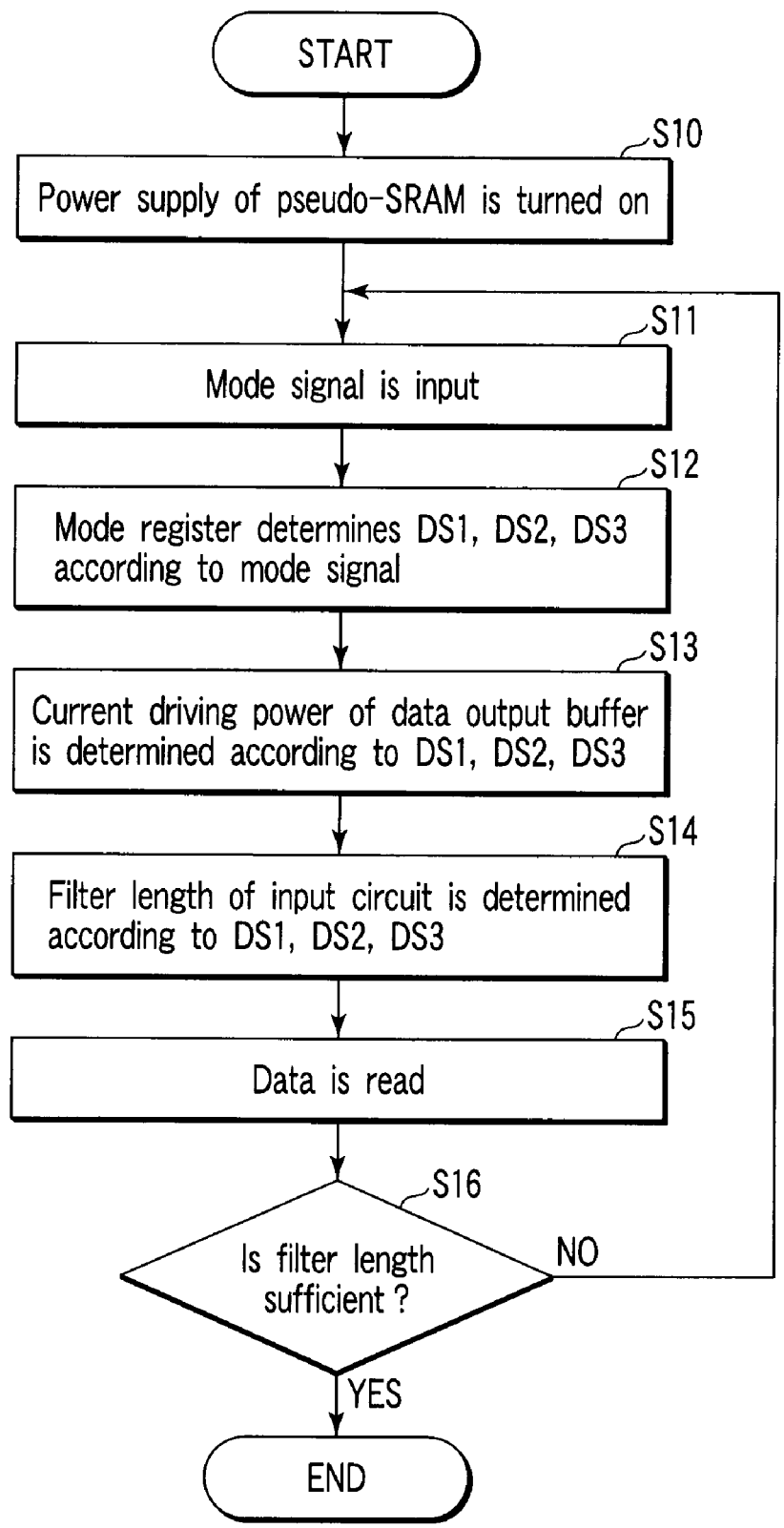
FIG. 5 is a flowchart to help explain the read operation of the PSRAM of the first embodiment.

Next, the read operation of the PSRAM 1 with the above configuration will be explained, particularly focusing attention on the input circuit 30 and output circuit 50. FIG. 5 is a flowchart to help explain the read operation.

As shown in FIG. 5, first, the power supply of the PSRAM 1 is turned on (step S10). Next, a mode signal is input (step S11). Any one of signals MODE1 to MODE 3 is input as a mode signal. Information indicated by the mode signal is the load on the circuit connected to the data output buffer 15 of the PSRAM 1. Specifically, when the load on the circuit connected to the data output buffer 15 is heavy, in other words, when the capacitance is large, the current driving capability of the data output buffer 15 has to be increased. Conversely, when the capacity is small, the current driving capability of the data output buffer 15 is allowed to be low. The mode signal indicates information on the capacity. In the first embodiment, the capacity is divided into three levels: MODE 1 corresponds to the lowest capacity, MODE 2 corresponds to the middle capacity and MODE 3 corresponds to the highest capacity.

When the mode signal is input, the mode register 20 determines drive control signals DS1 to DS3 (step S12). Specifically, according to the input mode signal, the mode register 20 refers to the drive control signal table 61 and generates not only drive control signals DS1 to DS3 but also drive control signals /DS1 to /DS3.

Determining drive control signals DS1 to DS3, /DS1 to /DS3 causes the current driving power of the output circuit 50 to be determined (step S13). That is, with the configuration of FIG. 3, the number of transistors to be turned on is determined. Moreover, according to drive control signals DS1 to DS3, /DS1 to /DS3, the filter length of the noise filter 39 of the input circuit 30 is determined (step S14). That is, with the configuration of FIG. 2, the number of MOS transistors functioning as capacitor elements in the noise filter 39 is determined.

Thereafter, the data is read from the memory cell MC of the memory cell array 10 (step S15). The read data is amplified at the sense amplifier 14. The data output buffer 15 outputs the amplified data to the circuit connected to the PSRAM 1. At this time, if the filter length is not sufficient (NO in step S16), control returns to step S11, where the mode signal is input again. If the filter length is sufficient (YES in step S16), the read operation is continued as needed.

Figure 6:
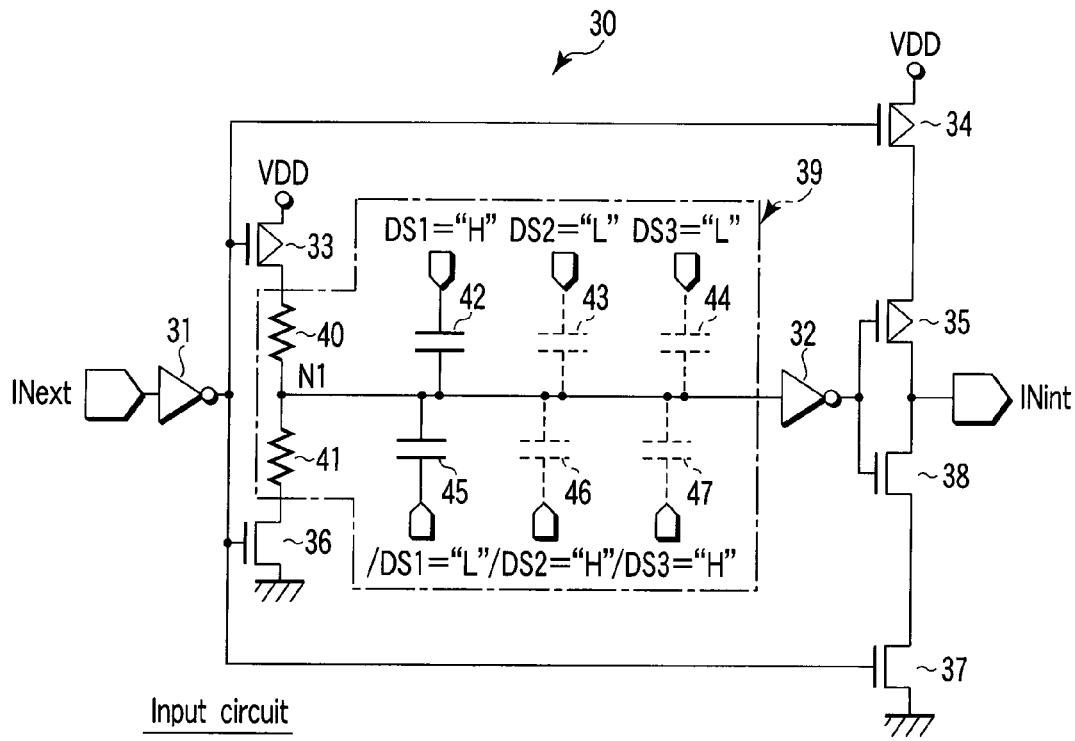
FIG. 6 is a circuit diagram of an input circuit included in the PSRAM of the first embodiment, showing a case where MODE1 has been input.
Figure 7:
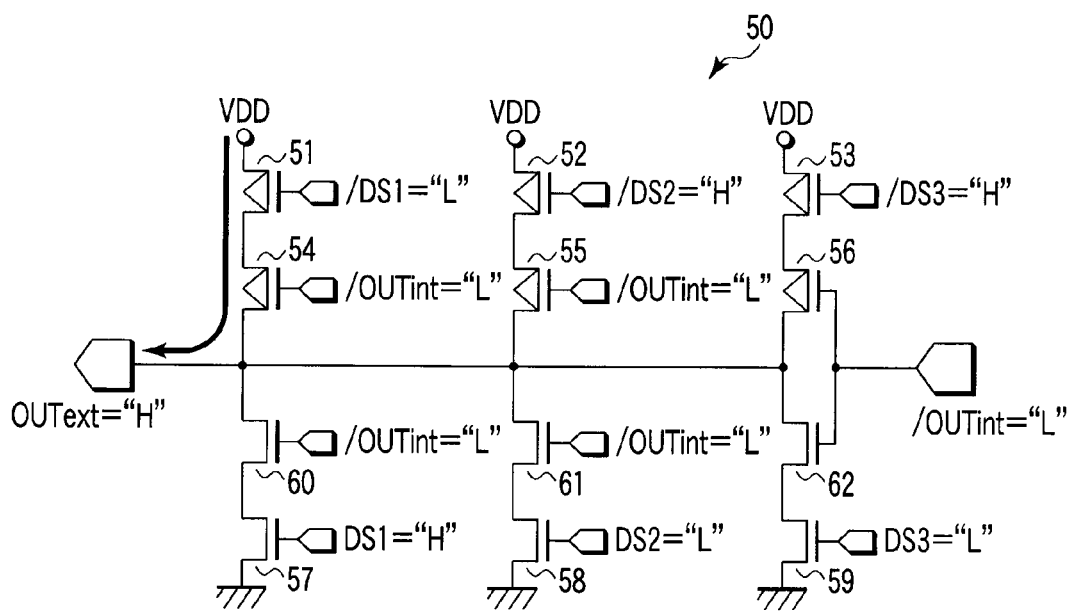
FIG. 7 is a circuit diagram of an output circuit included in the PSRAM of the first embodiment, showing a case where MODE1 has been input.

The operation of the input circuit 30 and output circuit 50 according to the mode signal will be explained concretely below. First, a case where signal MODE1 has been input as a mode signal will be explained using FIGS. 6 and 7. FIG. 6 is a circuit diagram of the input circuit 30. FIG. 7 is a circuit diagram of the output circuit 50. In FIG. 6, MOS transistors 42 to 47 in the noise filter 39 are written as capacitor elements. Those practically not functioning as capacitor elements are shown by broken lines. When MODE1 has been input, the mode register 20 sets the drive control signals as follows: DS1=High, DS2=Low, and DS3=Low.

First, the input circuit 30 will be explained. As shown in FIG. 6, with drive control signal DS1=High, DS2=Low, and DS3=Low, MOS transistors 43, 44, 46, 47 do not function as capacitor elements. Only MOS transistors 42, 45 function as capacitor elements. For example, if a high signal (with the address signal being "1") is input as an input signal, MOS transistors 33, 34 are turned on, which causes a high signal to appear at node N1 to be delayed by the RC circuit of resistance element 40 and MOS transistor 45. Then, when the high signal appears at node N1, the transistor 35 is turned on, outputting a high signal as an output signal INint.

Conversely, if a low signal (with the address signal being "0") has been input as an input signal, MOS transistors 36, 37 are turned on, which causes a low signal to appear at node N1 to be delayed by the RC circuit of resistance element 41 and MOS transistor 42. Then, when the low signal appears at node N1, the transistor 38 is turned on, outputting a low signal as an output signal INint.

Next, the output circuit 50 will be explained. FIG. 7 shows a case where input signal /OUTint is low (with read data being "1"). As shown in FIG. 7, since /OUTint=Low, MOS transistors 54 to 56 are on and MOS transistors 60 to 62 are off. With drive control signal DS1=High, DS2=Low, and DS3=Low, MOS transistors 52, 53, 58, 59 are turned off and MOS transistors 51, 57 are turned on. As a result, the power supply potential VDD supplies current via the current path of MOS transistors 51, 54, causing the output signal OUText to go high. When /OUTint is high, MOS transistor 60 is turned on in place of MOS transistor 54, causing OUText to go low.

Next, a case where signal MODE2 has been input as a mode signal will be explained using FIGS. 8 and 9. FIG. 8 is a circuit diagram of the input circuit 30. FIG. 9 is a circuit diagram of the output circuit 50. As in FIG. 6, in FIG. 8, MOS transistors 42 to 47 in the noise filter 39 are written as capacitor elements. Those not functioning as capacitor elements are shown by broken lines. When MODE2 has been input, the mode register 20 sets drive control signal DS1=High, DS2=High, and DS3=Low.

First, the input circuit 30 will be explained. As shown in FIG. 8, with drive control signal DS1=High, DS2=Low, and DS3=Low, MOS transistors 44, 47 do not function as capacitor elements and MOS transistors 42, 43, 45, 46 function as capacitor elements. For example, if a high signal (with the address signal being "1") has been input as an input signal, a high signal appearing at node N1 is delayed by the RC circuit of resistance element 40 and MOS transistors 45, 46. Conversely, if a low signal (with the address signal being "0") has been input as an input signal, a low signal appearing at node N1 is delayed by the RC circuit of resistance element 41 and MOS transistors 42, 43.

Next, the output circuit 50 will be explained. Like FIG. 7, FIG. 9 shows a case where input signal /OUTint is low (with read data being "1"). As shown in FIG. 9, since drive control signal DS1=High, DS2=High, and DS3=Low, MOS transistors 53, 59 are off and MOS transistors 51, 52, 57, 58 are on. As a result, the power supply potential VDD supplies current via the current path of MOS transistors 51, 54 and the current path of MOS transistors 52, 55, causing the output signal OUText to go high.

Figure 10:
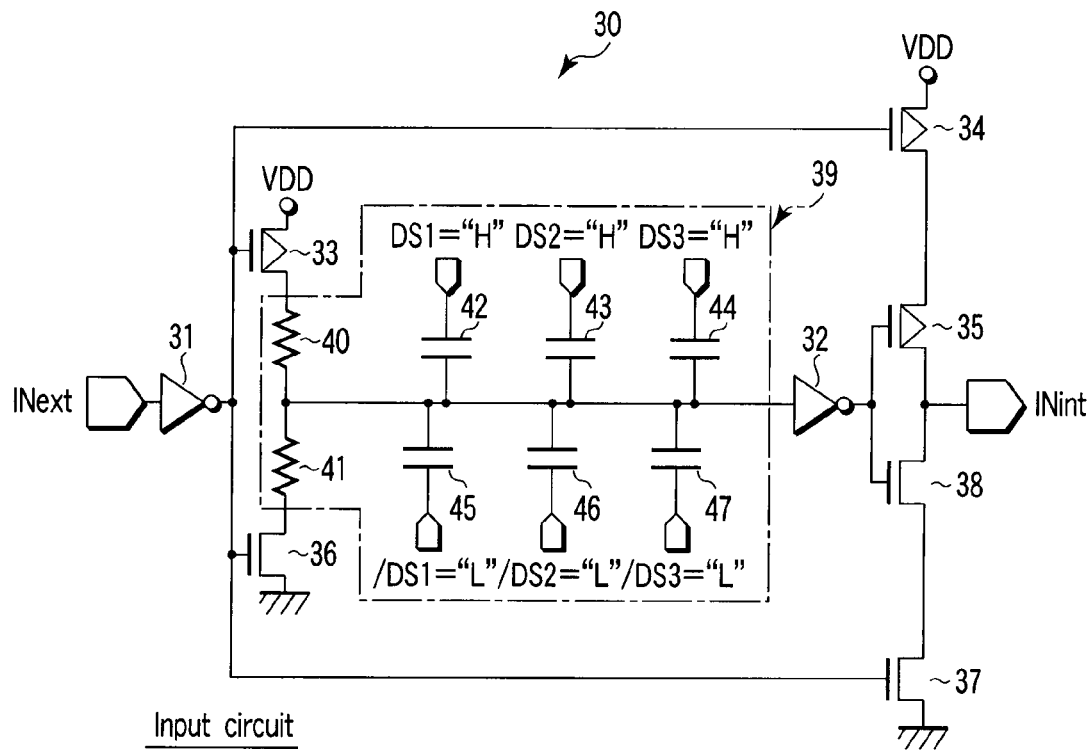
FIG. 10 is a circuit diagram of an input circuit included in the PSRAM of the first embodiment, showing a case where MODE3 has been input.
Figure 11:
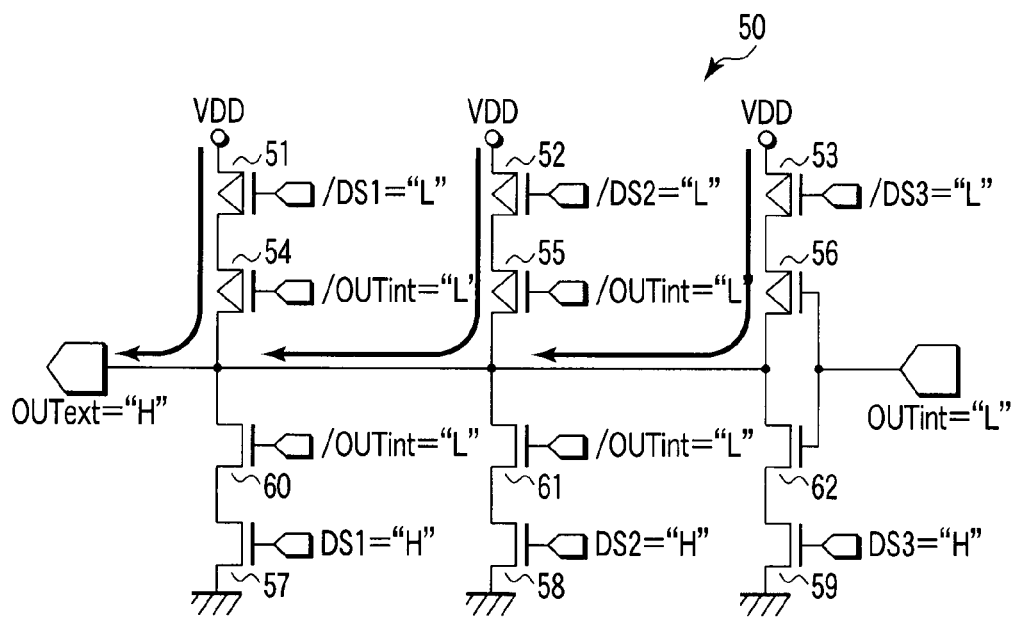
FIG. 11 is a circuit diagram of an output circuit included in the PSRAM of the first embodiment, showing a case where MODE3 has been input.

Next, a case where signal MODE3 has been input as a mode signal will be explained using FIGS. 10 and 11. FIG. 10 is a circuit diagram of the input circuit 30. FIG. 11 is a circuit diagram of the output circuit 50. As in FIG. 6, in FIG. 10, MOS transistors 42 to 47 in the noise filter 39 are written as capacitor elements. When MODE3 has been input, the mode register 20 sets drive control signal DS1=High, DS2=High, and DS3=High.

First, the input circuit 30 will be explained. As shown in FIG. 10, since drive control signal DS1=High, DS2=High, and DS3=High, all of MOS transistors 42 to 47 in the noise filter 39 function as capacitor elements. If a high signal (with the address signal being "1") has been input as an input signal, a high signal appearing at node N1 is delayed by the RC circuit of resistance element 40 and MOS transistors 45 to 47. Conversely, if a low signal (with the address signal being "0") has been input as an input signal, a low signal appearing at node N1 is delayed by the RC circuit of resistance element 41 and MOS transistors 42 to 44.

Next, the output circuit 50 will be explained. Like FIG. 7, FIG. 11 shows a case where input signal /OUTint is low (with read data being "1"). As shown in FIG. 11, since drive control signal DS1=High, DS2=High, and DS3=High, MOS transistors 51 to 53, 57 to 59 are on. As a result, the power supply potential VDD supplies current via the current path of MOS transistors 51, 54, the current path of MOS transistors 52, 55, and the current path of MOS transistors 53, 56 causing the output signal OUText to go high.

Figure 12:
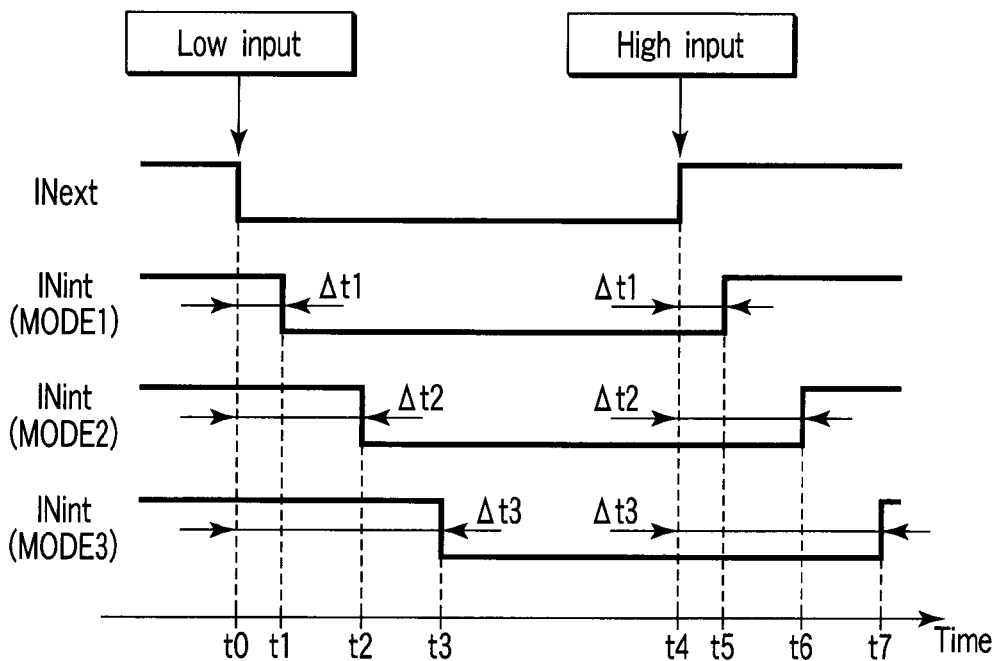
FIG. 12 is a timing chart for input data in the PSRAM of the first embodiment.
Figure 13:
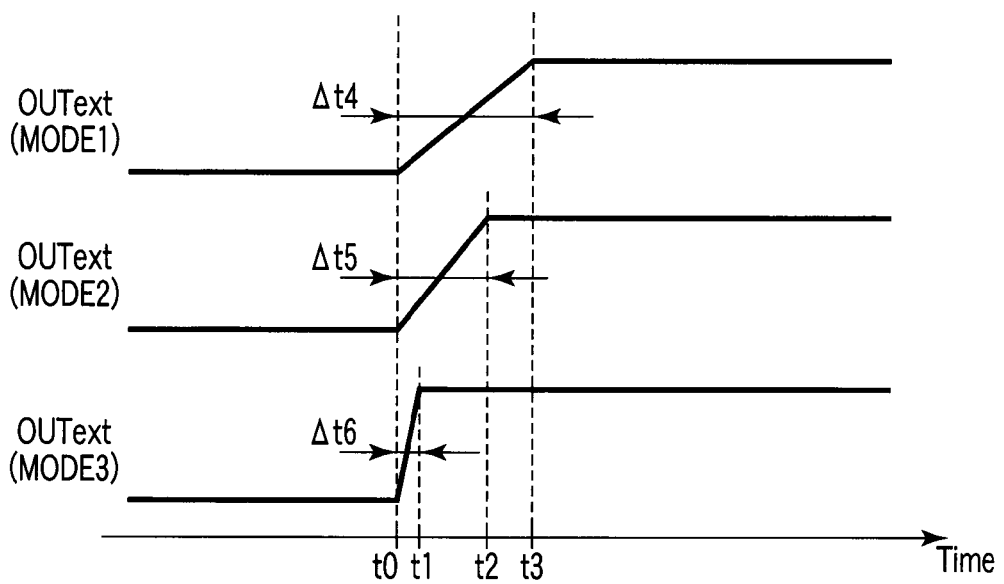
FIG. 13 is a timing chart for output data in the PSRAM of the first embodiment.

The filter length of the noise filter 39 and the current driving power of the output circuit 50 according to the mode signal explained using FIGS. 6 to 11 will be explained using FIGS. 12 and 13. The filter length is a delay time caused by the RC circuit in the noise filter 39. Delaying the input signal INext for a specific period of time prevents noise from getting mixed in the period. The current driving power of the output circuit 50 is the current supplying capability for the output node OUText of the output circuit. The current driving power is determined by how many of a plurality of MOS transistors connected to the output node OUText are turned on. FIG. 12 is a timing chart for the input signal INext in the input circuit 30 and the output signal INint when MODE1 to MODE3 have been input. FIG. 13 is a timing chart for the output signal OUText when MODE1 to MODE3 have been input, particularly showing a case when a high signal is output.

First, using FIG. 12, the filter length of the noise filter 39 in the input circuit 30 will be explained. As shown in FIG. 12, for example, suppose a low signal is input as an input signal INext at time t0 and a high signal is input as an input signal INext at time t4.

First, a case where signal MODE1 has been input will be explained. As shown in FIG. 12, when a low signal has been input, the RC circuit of resistance element 41 and MOS transistor 42 discharges node N1, causing the output signal INint to go low at time t1 Δt1 later than time t0. When a high signal has been input, the RC circuit of resistance element 40 and MOS transistor 45 charges node N1, causing the output signal INint to go high at time t5 Δt1 later than time t4. That is, the filter length in MODE1 is Δt1. Specifically, rejecting the input signal INext for a period of Δt1 prevents noise from getting mixed. While in the first embodiment, a case where the filter length is the same in both cases where a low signal is input and where a high signal is input has been explained, the filter length may differ between the input of the low signal and that of the high signal.

Next, a case where signal MODE2 has been input will be explained. As shown in FIG. 12, when a low signal has been input, the RC circuit of resistance element 41 and MOS transistors 42, 43 discharges node N1, causing the output signal INint to go low at time t2 Δt2 (>Δt1) later than time t0. When a high signal has been input, the RC circuit of resistance element 40 and MOS transistors 45, 46 charges node N1, causing the output signal INint to go high at time t6 Δt2 later than time t4. That is, the filter length in MODE2 is Δt2, longer than in MODE1.

Next, a case where signal MODE3 has been input will be explained. When a low signal has been input, the RC circuit of resistance element 41 and MOS transistors 42 to 44 discharges node N1, causing the output signal INint to go low at time t3 Δt3 (>Δt2) later than time t0. When a high signal has been input, the RC circuit of resistance element 40 and MOS transistors 45 to 47 charges node N1, causing the output signal INint to go high at time t7 Δt3 later than time t4. That is, the filter length in MODE3 is Δt3, longer than in MODE2.

Next, using FIG. 13, the current driving power of the output circuit 50 will be explained. As shown in FIG. 13, for example, suppose the output signal OUText goes high at time t0.

First, a case where signal MODE1 has been input will be explained. As shown in FIG. 13, only MOS transistors 51, 54 drive current. Accordingly, it is at time t3 Δt4 later than time to that the output signal OUText goes high.

Next, a case where signal MODE2 has been input will be explained. As shown in FIG. 13, not only MOS transistors 51, 54 but also MOS transistors 52, 55 drive current. Accordingly, it is at time t2 Δt5 (<Δt4) later than time t0 that the output signal OUText goes high.

Next, a case where signal MODE3 has been input will be explained. As shown in FIG. 13, not only MOS transistors 51, 54, 52, 55 but also MOS transistors 53, 56 drive current. Accordingly, it is at time t2 Δt6 (<Δt5) later than time t0 that the output signal OUText goes high.

As described above, when MODE1 has been input as a mode signal, the current driving power of the output circuit 50 is the lowest and the filter length of the noise filter 39 of the input circuit 40 is the shortest. Conversely, when MODE3 has been input as a mode signal, the current driving power of the output circuit 50 is the highest and the filter length of the noise filter 39 of the input circuit 30 is the longest.

As described above, the PSRAM according to the first embodiment produces the effect in item (1) below.

(1) The noise resistance of the PSRAM can be improved, while the operating speed of the PSRAM is being improved (part 1).

With the configuration of the first embodiment, the filter length of the noise filter 39 and the current driving power of the output circuit 50 are controlled by the mode signal. Therefore, the noise resistance can be improved, while the operating speed of the PSRAM is being improved. The effect will be explained in detail below.

Figure 14:
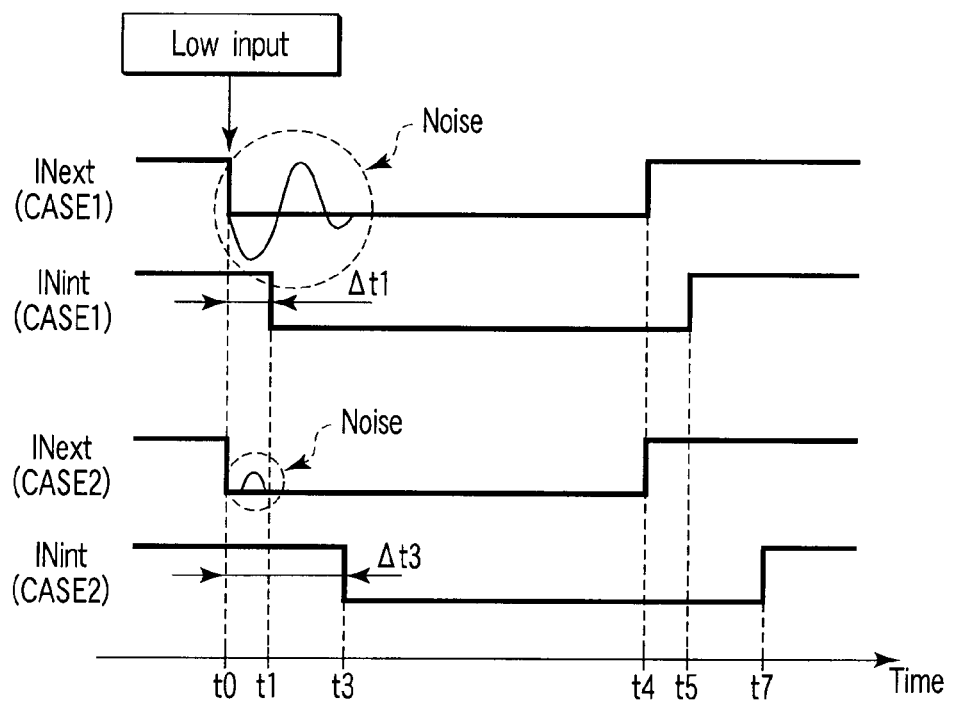
FIG. 14 is a timing chart for input data in the PSRAM.

FIG. 14 is a timing chart for the input signal INext and output signal INint of the input circuit, showing a case (CASE1) where the filter length of the noise filter is fixed at Δt1 and a case (CASE2) where the filter length is fixed at Δt3.

As shown in FIG. 14, in CASE1, since the filter length is short, the operating speed of the PSRAM is fast. However, if large noise has occurred, the filter length is insufficient, contributing to, for example, erroneous reading. As the operating speed or the number of output bits increases, power-supply noise or the like tends to increase.

In this situation, suppose the filter length is designed to be Δt3 longer as in CASE2. In this case, large noise that cannot be dealt with in CASE1 can be dealt with. However, in the case of small noise as shown in FIG. 14, the filter length is too long. As the filter length is greater, the operating speed becomes slower. That is, in the case of FIG. 14, the filter length is unnecessarily great, contributing to a decrease in the operating speed.

Figure 15:
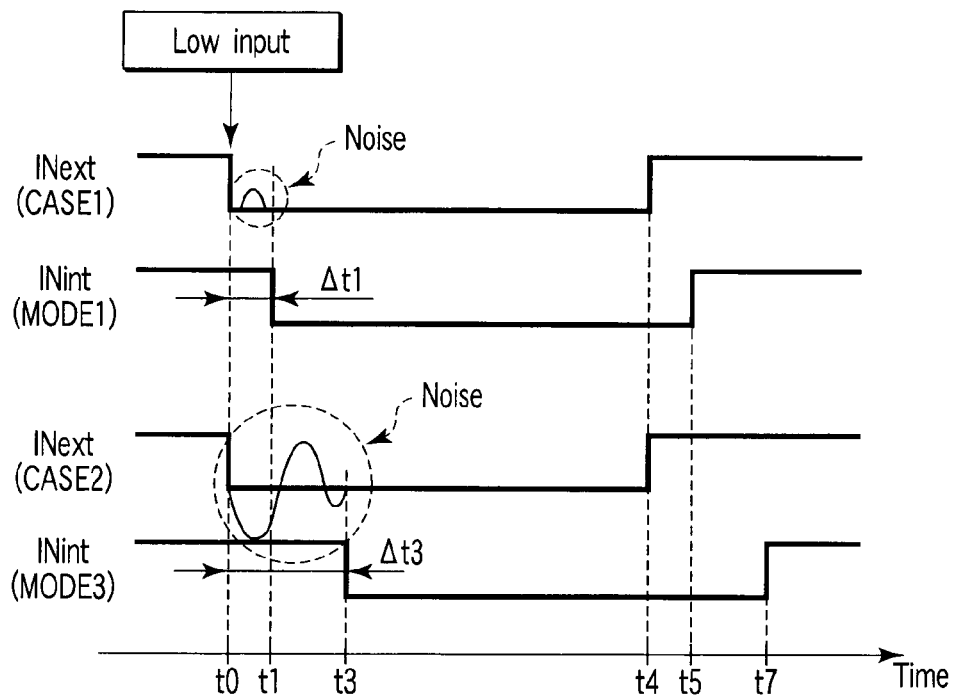
FIG. 15 is a timing chart for input data in the PSRAM of the first embodiment.

However, in the first embodiment, the filter length is controlled by the mode signal. This will be explained using FIG. 15. FIG. 15 is a timing chart for the input signal INext and output signal INint of the input circuit 30 of the first embodiment, showing a case where MODE1 and MODE3 have been input as mode signals.

As shown in FIG. 15, when MODE1 has been input as a mode signal, the filter length is set to the shortest Δt1. As described above, when the capacity of the circuit to which the PSRAM 1 is connected is small and when the current driving power of the output circuit 50 is the lowest, MODE1 is input. The power-supply noise is influenced particularly by the output current of the output circuit 50. The larger the output current is, the larger the power-supply noise is. In this respect, since MODE1 is input when the output current of the output circuit 50 is the smallest, noise generated is small as explained in CASE1. Accordingly, the short filter length Δt1 is sufficient to deal with power-supply noise.

On the other hand, when MODE3 has been input, the filter length is set to the longest Δt3. MODE3 is input when the capacity of the circuit to which the PSRAM 1 is connected is large and when the current driving power of the output circuit 50 is the highest. That is, since MODE3 is input when the output current of the output circuit 50 is the largest, noise generated is large as explained in CASE2. In this case, however, since the filter length is set to the longest Δt3, power-supply noise can be dealt with sufficiently.

As described above, with the configuration of the first embodiment, when the current driving power of the data output buffer circuit 15 has to be increased, the chances are high that the noise is large. Thus, the filter length of the noise filter 39 included in the input circuit 30 of the address buffer 16 is made greater. In contrast, when the current driving power of the data output buffer 15 is allowed to be low, noise is small in most cases. Thus, the filter length of the noise filter 39 is made shorter. That is, according to the magnitude of noise to be generated, the filter length of the noise filter 39 is varied. Accordingly, there is no possibility that the filter length will be unnecessarily lengthened, decreasing the operating speed or that the filter length will be too short, decreasing the noise resistance. Consequently, the filter length can be set to the adequate value. As a result, the noise resistance can be improved, while the operating speed of the PSRAM is being improved.

In the first embodiment, the case where the filter length of the noise filter 39 in the address buffer 16 is controlled has been explained. In addition to the address buffer 16, the first embodiment may be applied to, for example, the noise filter in the input buffer 18 of FIG. 1. Like the address buffer 16, the input buffer 18 also includes the input circuit 30 of FIG. 2. The input signal INext is a control signal. The operation of the input circuit 30 in the input buffer 18 is the same as that of the input circuit 30 in the address buffer 16. In this case, too, the above effect is obtained from the input buffer 18. Control of the filter length by the mode signal may be performed for either the address buffer 16 or input buffer 18 or both of them.

Second Embodiment

Next, a semiconductor memory device according to a second embodiment of the invention will be explained. The second embodiment is such that the filter length of the noise filter 39 is controlled according to the number of output bits in the first embodiment.

The block configuration of a PSRAM according to the second embodiment is the same as that of FIG. 1. Only what differs from the first embodiment will be explained below. FIG. 16 is a circuit diagram of the input circuit 30 in the address buffer included in the PSRAM 1 according to the second embodiment. As shown in FIG. 16, the input circuit 30 of the second embodiment is configured to control MOS transistors 42 to 47 using filter length control signals FL1 to FL3, /FL1 to /FL3 in place of drive control signals DS1 to DS3, /DS1 to /DS3 in the configuration of FIG. 2 explained in the first embodiment. The remaining configuration is the same as that of FIG. 2. Filter length control signals FL1 to FL3, /FL1 to /FL3 will be described below.

Figure 17:
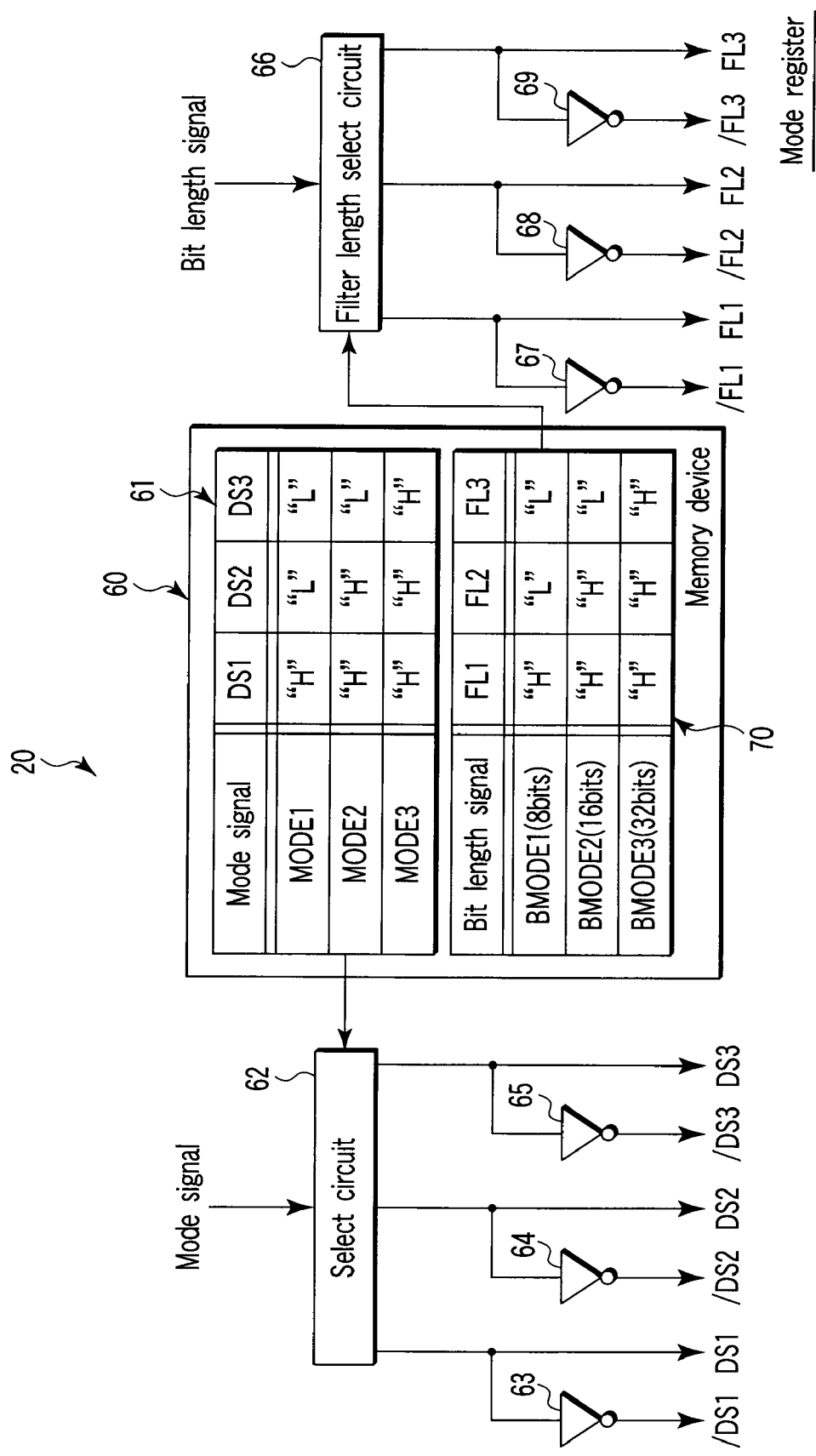
FIG. 17 is a circuit diagram of a mode register included in the PSRAM of the second embodiment.

FIG. 17 is a circuit diagram of the mode register included in the PSRAM 1 of the second embodiment. As shown in FIG. 17, the mode register 20 of the second embodiment includes a filter length select circuit 66, inverters 67 to 69 and the memory device 60 includes a filter length control table 70 in the configuration explained using FIG. 4 in the first embodiment.

Like the drive control signal table 61, the filter length control table 70 is written in advance by the user of the PSRAM 1 into the memory device 60 or in manufacturing the PSRAM 1. In the filter length control table 70, control information on filter length control signals FL1 to FL3 according to externally input bit length signals have been stored. In the example of FIG. 17, three signals BMODE1 to BMODE3 are prepared as bit length signals. The filter length control table 70 holds the following information: if BMODE1 has been input as a bit length signal, filter length control signal FL1 is made high, and FL2 and FL3 are made low; if BMODE2 has been input as a bit length signal, filter length control signals FL1 and FL2 are made high, and FL3 is made low; and if BMODE3 has been input as a bit length signal, filter length control signals FL1 to FL3 are all made high. The details of the bit length signals will be described later.

According to the externally input bit length signal, the select circuit 66 reads information on filter length control signals FL1 to FL3 from the filter length control signal table 70 in the memory device 60 and generates filter length control signals FL1 to FL3 according to the read information. Inverters 67 to 69 invert filter length control signals FL1 to FL3, respectively, and generates filter length control signals /FL1 to /FL3.

Figure 18:
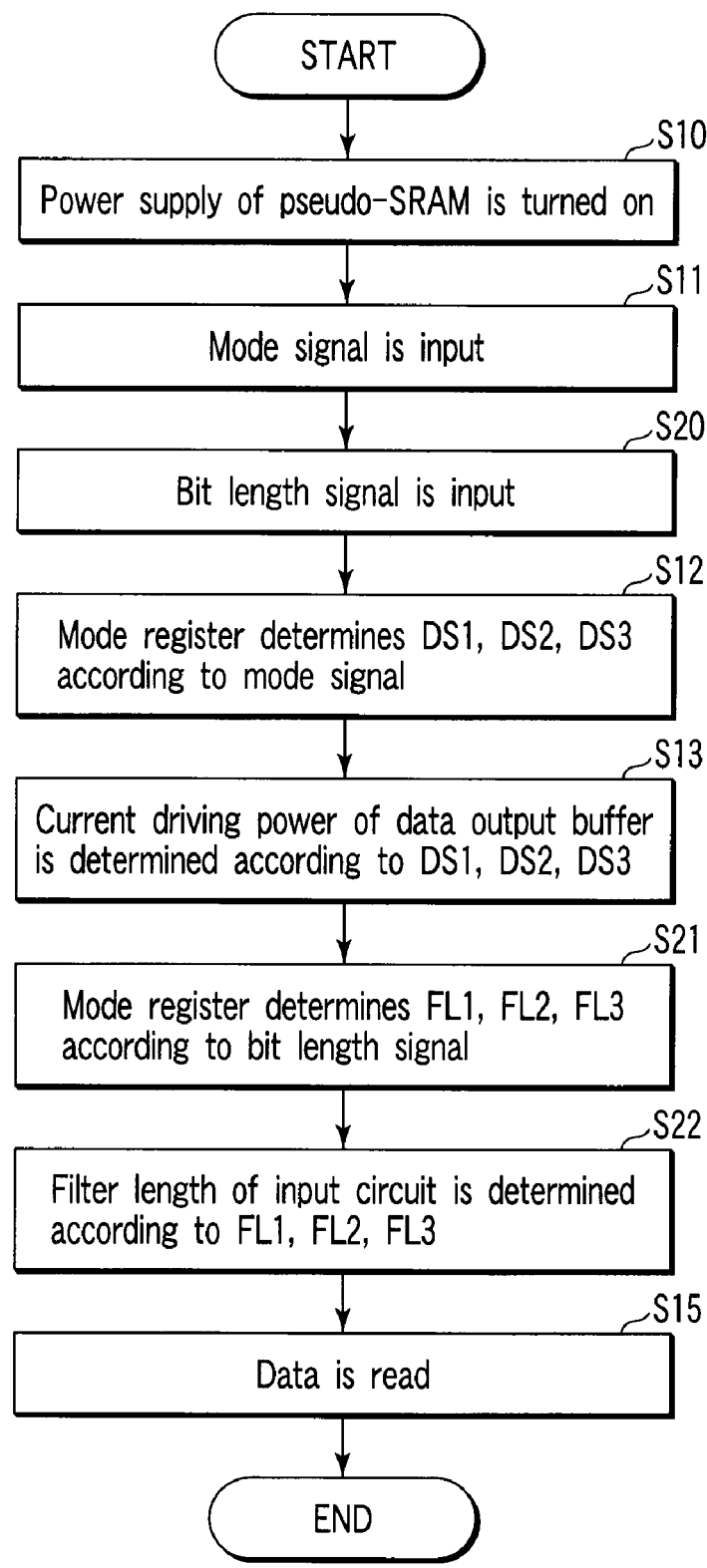
FIG. 18 is a flowchart to help explain the read operation of the PSRAM of the second embodiment.

Next, the read operation of the PSRAM 1 with the above configuration will be explained, particularly focusing attention on the input circuit 30 and data output buffer 15. FIG. 18 is a flowchart for a read operation.

As shown in FIG. 18, first, the power supply of the PSRAM 1 is turned on (step S10). Next, a mode signal is input (step S11). Then, a bit length signal is input (step S20). Any one of signals BMODE1 to BMODE3 is input as a bit length signal. The bit length signal indicates information on the number of bits in the read data output from the PSRAM 1. Specifically, the number of bits in data to be read from the PSRAM 1 at a time differs according to the circuit connected to the PSRAM 1. In the second embodiment, since the data output buffer 15 includes 32 output circuits 50, it can output a maximum of 32 bits of read data. However, the necessary number of bits might be 16. In such a case, the PSRAM 1 is externally informed in the form of a bit length signal that the necessary number of bits is 16. Then, the PSRAM 1 uses half of, or 16 of, the 32 output circuits 50 and disables the remaining 16 output circuits. In the second embodiment, the number of output bits is divided into three stages: 8 bits of read data are output in BMODE1, 16 bits of read data are output in BMODE2, and 32 bits of read data are output in BMODE3.

When the mode signal is input, the mode register 20 determines drive control signals DS1 to DS3 (step S12). Determining drive control signals DS1 to DS3, /DS1 to /DS3 causes the current driving power of the output circuit 50 to be determined (step S13).

Moreover, when the bit length signal has been input, the mode register 20 determines filter length control signals FL1 to FL3 (step S21). That is, according to the input bit length signal, the mode register refers to the filter length control signal table 70 and generates filter length control signals FL1 to FL3. At the same time, the mode register 20 also generates filter length control signals /FL1 to /FL3. Determining filter length control signals FL1 to FL3, /FL1 to /FL3 causes the filter length of the noise filter 39 to be determined (step S22). That is, with the configuration of FIG. 16, the number of MOS transistors functioning as capacitor elements is determined. Thereafter, data is read from the memory cell MC of the memory call array 10 (step S15).

Figure 19:
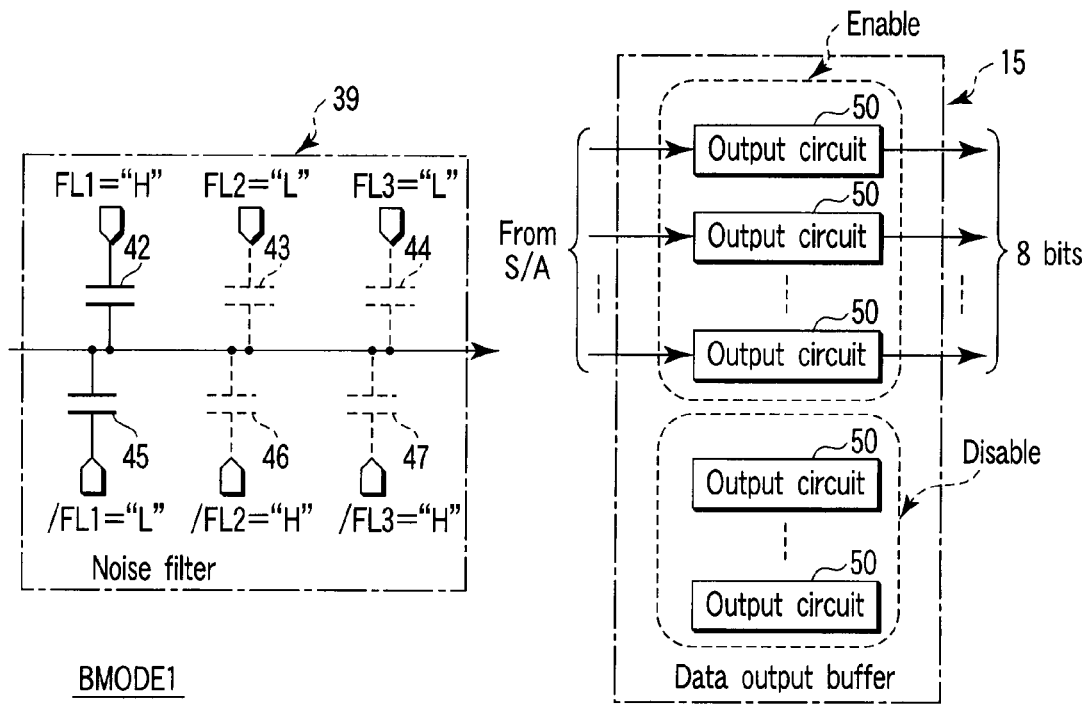
FIG. 19 is a circuit diagram of a noise filter and a data output buffer included in the PSRAM of the second embodiment, showing a case where MODE1 has been input.

The operation of the input circuit 30 and data output buffer 15 according to the mode signal will be explained concretely below. First, a case where signal BMODE1 has been input as a bit length signal will be explained using FIG. 19. FIG. 19 is a circuit diagram of a part of the noise filter 39 and the data output buffer 15. In FIG. 19, MOS transistors 42 to 47 in the noise filter 39 are written as capacitor elements and those not functioning as capacitor elements are shown by broken lines. When BMODE1 has been input, the mode register 20 sets filter length control signal FL1=High, FL2=Low, and FL3=Low.

As shown in FIG. 19, since filter length control signal FL1=High, FL2=Low, and FL3=Low in the noise filter 39, MOS transistors 43, 44, 46, 47 do not function as capacitor elements and only MOS transistors 42, 45 function as capacitor elements. This is the same as when mode signal MODE1 has been input in the first embodiment. Accordingly, the filter length is set to the shortest Δt1. Moreover, since BMODE1 has been input, eight of the 32 output circuits 50 are enabled, outputting 8 bits of read data. The remaining 24 output circuits are disabled.

Figure 20:
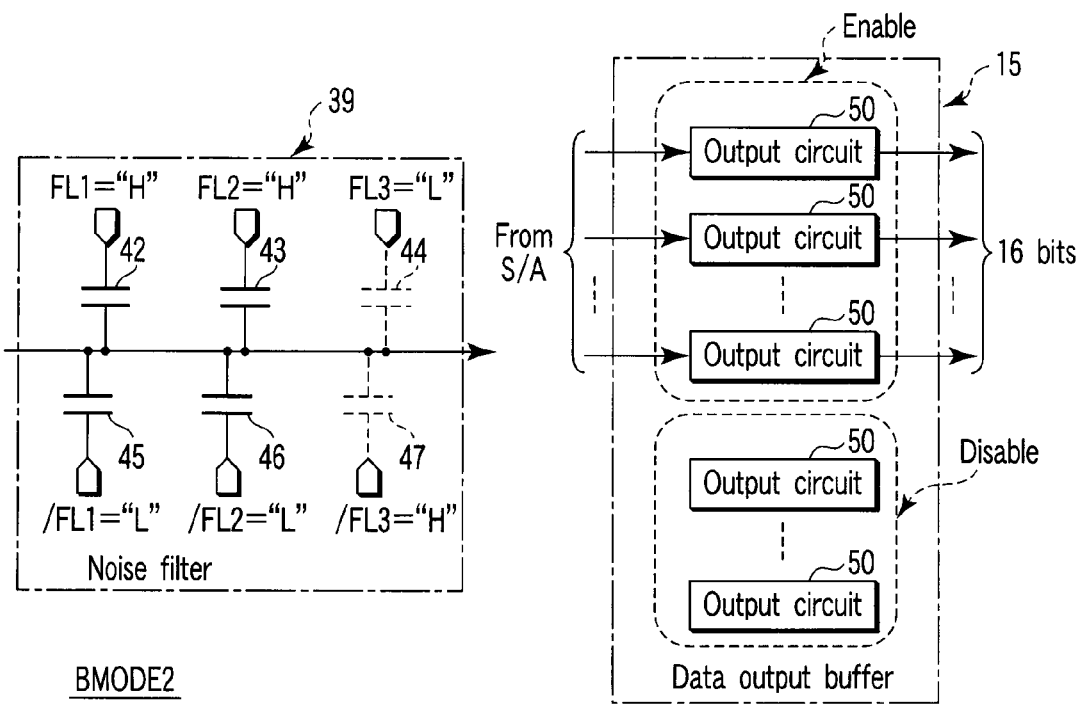
FIG. 20 is a circuit diagram of a noise filter and a data output buffer included in the PSRAM of the second embodiment, showing a case where MODE2 has been input.

Next, a case where signal BMODE2 has been input as a bit length signal will be explained using FIG. 20. FIG. 20 is a circuit diagram of a part of the noise filter 39 and the data output buffer 15. As in FIG. 19, in FIG. 20, MOS transistors 42 to 47 in the noise filter 39 are written as capacitor elements and those not functioning as capacitor elements are shown by broken lines. When BMODE2 has been input, the mode register 20 sets filter length control signal FL1=High, FL2=High, and FL3=Low.

As shown in FIG. 20, since filter length control signal FL1=High, FL2=High, and FL3=Low in the noise filter 39, MOS transistors 44, 47 do not function as capacitor elements and MOS transistors 42, 43, 45, 46 function as capacitor elements. This is the same as when mode signal MODE2 has been input in the first embodiment. Accordingly, the filter length is set to Δt2 (>Δt1). Moreover, since BMODE2 has been input, 16 of the 32 output circuits 50 are enabled, outputting 16 bits of read data. The remaining 16 output circuits are disabled.

Figure 21:
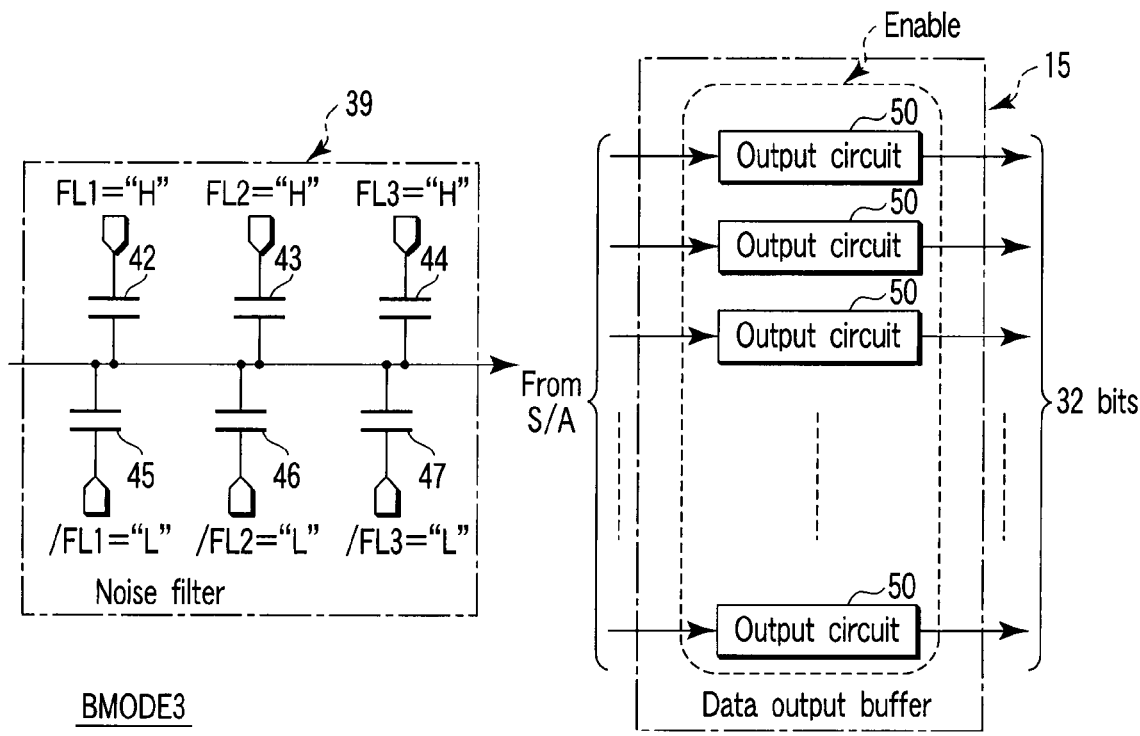
FIG. 21 is a circuit diagram of a noise filter and a data output buffer included in the PSRAM of the second embodiment, showing a case where MODE3 has been input.

Next, a case where signal BMODE3 has been input as a bit length signal will be explained using FIG. 21. FIG. 21 is a circuit diagram of a part of the noise filter 39 and the data output buffer 15. As in FIG. 19, in FIG. 21, MOS transistors 42 to 47 in the noise filter 39 are written as capacitor elements. When BMODE3 has been input, the mode register 20 sets filter length control signal FL1=High, FL2=High, and FL3=High.

As shown in FIG. 21, since filter length control signal FL1=High, FL2=High, and FL3=High in the noise filter 39, all of MOS transistors 42 to 47 function as capacitor elements. This is the same as when mode signal MODE3 has been input in the first embodiment. Accordingly, the filter length is set to Δt3 (>Δt2). Moreover, since BMODE3 has been input, all of the 32 output circuits 50 are enabled, outputting 32 bits of read data.

Specifically, as explained using FIG. 12 in the first embodiment, in the second embodiment, the filter length is set to any one of Δt1, Δt2, and Δt3 by filter length control signals FL1 to FL3. The second embodiment differs from the first embodiment in that the filter length is controlled by the bit length signal, not by the mode signal. The current driving power of the output circuit 50 is controlled by the mode signal. The operation of the output circuit 50 is the same as in the first embodiment.

As described above, the PSRAM according to the second embodiment produces the effect in item (2) below.

(2) The noise resistance of the PSRAM can be improved, while the operating speed of the PSRAM is being improved (part 2).

With the configuration of the second embodiment, the filter length of the noise filter 39 is controlled by the bit length signal. Therefore, the noise resistance can be improved, while the operating speed of the PSRAM is being improved. The effect will be explained in detail below.

Figure 22:
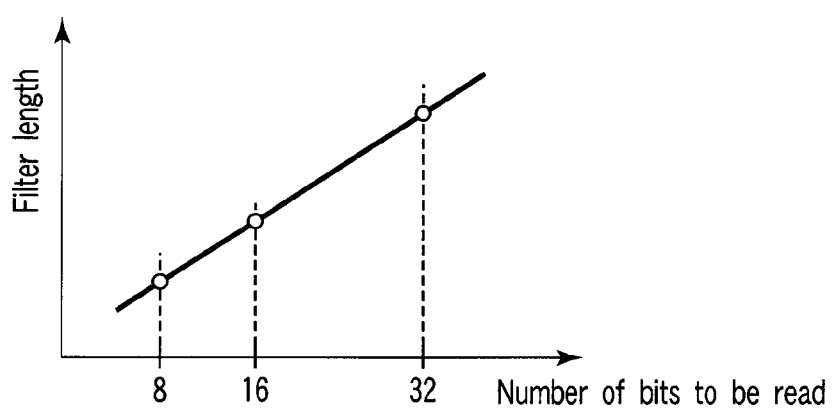
FIG. 22 is a graph showing a change in the filter length with respect to the number of bits to be read in the PSRAM of the second embodiment.

FIG. 22 is a graph showing the relationship between the number of read bits and the filter length in the PSRAM of the second embodiment. In general, as the number of read bits increases, power-supply noise increases. The reason is that as the number of bits to be read increases, the number of output circuits 50 operating in the data output buffer 15 increases. In this respect, with the configuration of the second embodiment, as the number of bits to be read increases as shown in FIG. 22, the filter length of the noise filter 39 is made greater accordingly. That is, since there is a strong possibility that noise will become larger when the number of bits to be read is larger, the filter length of the noise filter 29 is made greater. On the other hand, when the number of bits to be read is small, noise is also small in most cases. Thus, the filter length of the noise filter 39 is made shorter. That is, according to the magnitude of noise to be generated, the filter length of the noise filter 39 is varied. Accordingly, as explained using FIG. 15 in the first embodiment, the filter length can be set to the adequate value without lengthening the filter length unnecessarily to lower the operating speed or making the filter length unnecessarily short to decrease the noise resistance. As a result, the noise resistance can be improved, while the operating speed of the PSRAM is being improved.

Like the first embodiment, the second embodiment may be applied to, for example, the noise filter in the input buffer 18 in addition to the address buffer 16. The above effect is obtained from the input buffer 18.

Third Embodiment

Next, a semiconductor memory device according to a third embodiment of the invention will be explained. The third embodiment is such that the bit length signal is related to drive control signals DS1 to DS3 in the second embodiment, thereby controlling the filter length of the noise filter 39 and the current driving power of the output circuit 50 by the bit length signal.

Figure 23:
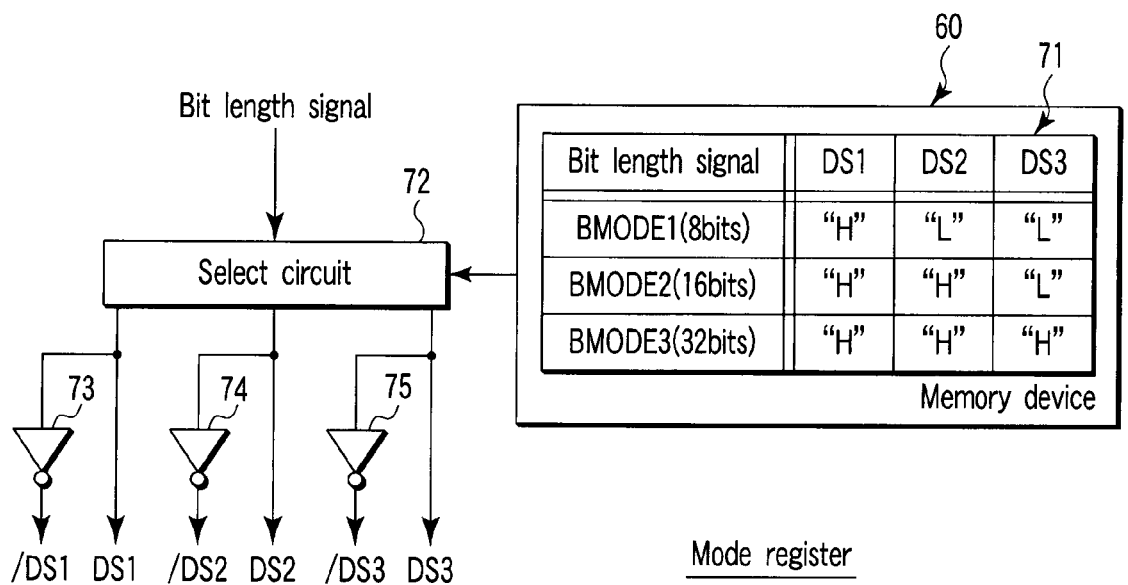
FIG. 23 is a circuit diagram of a mode register included in a PSRAM according to a third embodiment of the invention.

The block configuration of the PSRAM1 according to the third embodiment is the same as that of FIG. 1 explained in the first embodiment, except that a bit length signal is used in place of the mode signal. The address buffer 16 and data output buffer 15 have the configurations as shown in FIGS. 2 and 3, respectively, explained in the first embodiment. FIG. 23 is a circuit diagram of the mode register 20 according to the third embodiment.

As shown in FIG. 23, the mode register 20 includes a memory device 60, a select circuit 72, and inverters 73 to 75. As explained in the first embodiment, the memory device 60 is a semiconductor memory, such as a DRAM or a flash memory, and holds a drive control signal table 71. The drive control signal table 71 is written into the memory device 60 in advance by the user of the PSRAM 1 or in manufacturing the PSRAM 1. The drive control signal table 71 of the third embodiment differs from the table 61 of the first embodiment in that the drive control signal table 71 stores control information on drive control signals DS1 to DS3 according to the bit length signal. In the example of FIG. 23, three signals BMODE1 to BMODE3 are prepared for bit length signals. In the drive control signal table, the following information is stored: when BMODE1 has been input, drive control signal DS1 is made high, and DS2 and DS3 are made low; when BMODE2 has been input, drive control signals DS1 and DS2 are made high, and DS3 is made low; and when BMODE3 has been input, drive control signals DS1 to DS3 are all made high.

According to the externally input bit length signal, the select circuit 72 reads information about drive control signals DS1 to DS3 from the drive control signal table 71 in the memory device 60. Then, according to the read information, the select circuit 72 generates drive control signals DS1 to DS3. Inverters 73 to 75 invert drive control signals DS1 to DS3, respectively, thereby generating drive control signals /DS1 to /DS3.

Figure 24:
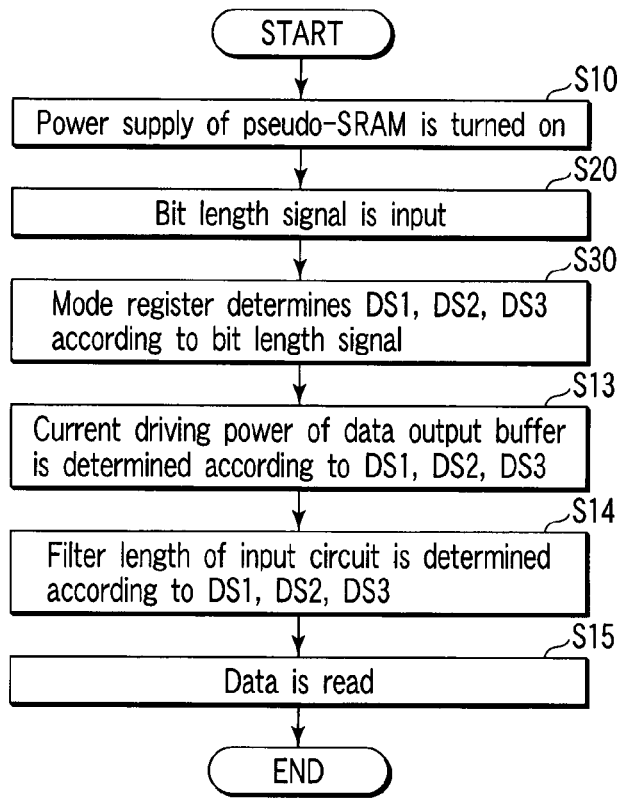
FIG. 24 is a flowchart to help explain the read operation of the PSRAM of the third embodiment.

Next, the read operation of the PSRAM 1 with the above configuration will be explained, particularly focusing attention on the input circuit 30 and output circuit 50. FIG. 24 is a flowchart to help explain the read operation.

As shown in FIG. 24, first, the power supply of the PSRAM 1 is turned on (step S10). Next, a bit length signal is input (step S20). When a bit length signal has been input, the mode register 20 determines drive control signals DS1 to DS3 (step S30). Specifically, the mode register refers to the drive control signal table 71 according to the input bit length signal and generates drive control signals DS1 to DS3. At the same time, the mode register generates drive control signals /DS1 to /DS3.

Determining drive control signals DS1 to DS3, /DS1 to /DS3 causes the current driving power of the output circuit 50 to be determined (step S13). That is, in the configuration of FIG. 3, the number of MOS transistors to be turned on is determined. Moreover, according to drive control signals DS1 to DS3, /DS1 to /DS3, the filter length of the noise filter 39 of the input circuit 30 is determined (step S14). That is, in the configuration of FIG. 2, the number of MOS transistors to function as capacitor elements in the noise filter is determined. Moreover, according to the bit length signal, the number of output circuits 50 to be enabled in the configuration of FIG. 3 is determined. Thereafter, data is read from the memory cell MC of the memory cell array 10 (step S15).

The operation of the input circuit 30 and output circuit 50 according to the bit length signal will be explained concretely below.

First, when BMODE1 has been input, the mode register 20 sets drive control signal DS1=High, DS2=Low, and DS3=Low. Accordingly, in the noise filter 39 of the input circuit 30, MOS transistors 42, 45 function as capacitor elements as shown in FIG. 6, with the result that the filter length is Δt1. In the data output buffer 15, eight output circuits 50 are enabled as shown in FIG. 19, thereby outputting 8 bits of read data. Moreover, in the eight output circuits 50 enabled, MOS transistors 51, 57 are turned on as shown in FIG. 7.

Next, when BMODE2 has been input, the mode register 20 sets drive control signal DS1=High, DS2=High, and DS3=Low. Accordingly, in the noise filter 39 of the input circuit 30, MOS transistors 42, 43, 45, 46 function as capacitor elements as shown in FIG. 8, with the result that the filter length is Δt2. In the data output buffer 15, 16 output circuits 50 are enabled as shown in FIG. 20, thereby outputting 16 bits of read data. Moreover, in the 16 output circuits 50 enabled, MOS transistors 51, 52, 57, 58 are turned on as shown in FIG. 9.

Next, when BMODE3 has been input, the mode register 20 sets drive control signal DS1=High, DS2=High, and DS3=High. Accordingly, in the noise filter 39 of the input circuit 30, all of MOS transistors 42 to 47 function as capacitor elements as shown in FIG. 10, with the result that the filter length is Δt3. In the data output buffer 15, 32 output circuits 50 are all enabled as shown in FIG. 21, thereby outputting 32 bits of read data. Moreover, in the 32 output circuits 50 enabled, MOS transistors 51, 52, 53, 57, 58, 59 are turned on as shown in FIG. 11.

As described above, the PSRAM of the third embodiment produces the effect in item (3) described below.

(3) The noise resistance of the PSRAM can be improved, while the operating speed of the PSRAM is being improved (part 3).

With the configuration of the third embodiment, the filter length of the noise filter 39 and the current driving power of the output circuit 50 are controlled by the bit length signal. Therefore, the noise resistance can be improved, while the operating speed of the PSRAM is being improved. The effect will be explained in detail below.

Figure 25:
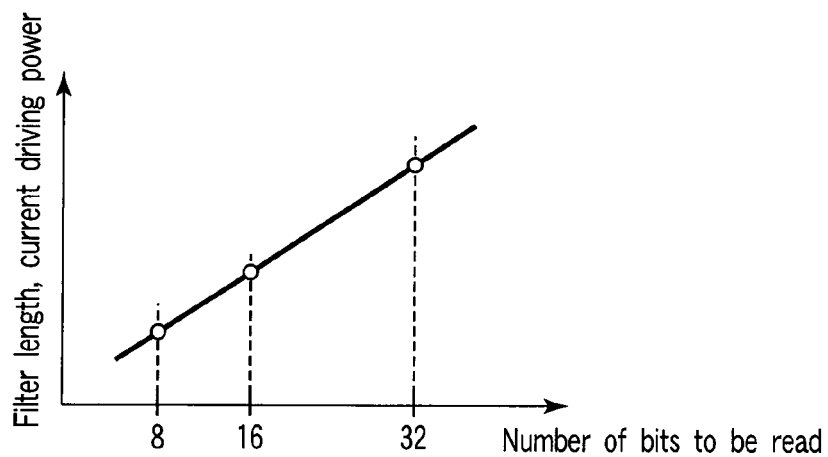
FIG. 25 is a graph showing a change in the filter length and a change in the current driving power with respect to the number of bits to be read in the PSRAM of the third embodiment.

FIG. 25 is a graph showing the relationship between the filter length and current driving power and the number of bits to be read in the PSRAM of the third embodiment. The abscissa indicates the number of bits to be read and the ordinate indicates the filter length of the noise filter 39 and the current driving power of the output circuit 50. As described above, as the number of bits to be read increases, power-supply noise increases. Therefore, in the third embodiment, as the number of bits to be read increases, the filter length of the noise filter 39 is made greater. This produces the effect in item (2) explained in the second embodiment.

Furthermore, there may be a case where the current driving power has to be increased as the number of bits to be read increases. In this case, controlling the current driving power by the bit length signal as in the third embodiment reduces the number of select circuits by one as compared with in the second embodiment, which simplifies the circuit configuration. Moreover, since increasing the number of bits to be read makes the filter length of the noise filter 39 greater, even if noise increases as a result of increasing the current driving power, the occurrence of erroneous operations due to the increased noise is suppressed. As described above, control may be performed according to the number of bits to be read in such a manner that the filter length of the noise filter 39 and the current driving power of the output circuit 50 are interlocked with each other.

Like the first and second embodiments, the third embodiment may be applied to, for example, the noise filter in the input buffer 18 in addition to the address buffer 16. The above effect is obtained from the input buffer 18.

Fourth Embodiment

Next, a semiconductor memory device according to a fourth embodiment of the invention will be explained. The fourth embodiment is such that the PSRAM operates in synchronization with a clock in the first to third embodiments.

Figure 26:
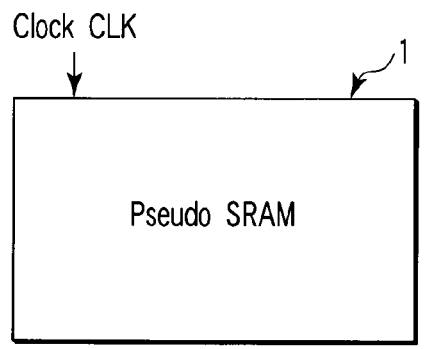
FIG. 26 is a block diagram of a PSRAM according to a fourth embodiment of the invention.

FIG. 26 is a block diagram of the PSRAM 1 according to the fourth embodiment. As shown in FIG. 26, a clock CLK is externally input to the PSRAM 1. The address buffer 16 takes in an address signal in synchronization with the clock CLK. The data output buffer 15 outputs read data in synchronization with the clock CLK. The remaining configuration and operation are the same as described in the first to third embodiments, so an explanation of them will be omitted.

Figure 27:
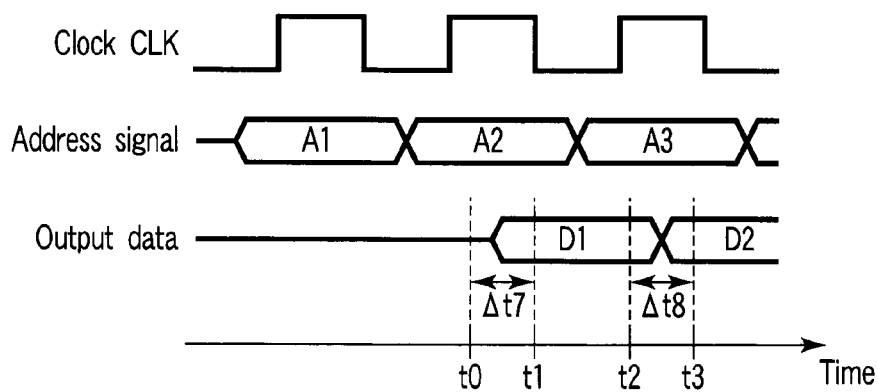
FIG. 27 is a timing chart for an address signal and output data in the PSRAM of the fourth embodiment.

FIG. 27 is a timing chart for the clock CLK, an externally input address signal, and the output data output from the data output buffer 15. As shown in FIG. 27, address signals A1, A2, A3 are input to the PSRAM 1 in synchronization with the clock CLK. The address signal is taken in by the address buffer 16 with the timing of, for example, the rising edge of the clock CLK. Output data D1, D2 are also output from the output data buffer 15 in synchronization with the clock CLK.

The PSRAM 1 of the fourth embodiment produces the effect in item (4) below in addition to any one of the effects explained in item (1) to item (3) explained in the first to third embodiments.

(4) Control of the noise filter is easy.

The timing with which the power supply voltage fluctuates greatly to increase power-supply noise is the timing with which the data output buffer 15 outputs read data. In this respect, data is input and output in synchronization with the clock in the configuration of the fourth embodiment. That is, the timing with which the data output buffer 15 outputs read data is known. For example, in the example of FIG. 27, a period of Δt7 between t0 to t1 and a period of Δt8 between t2 to t3 are that timing. Accordingly, the noise filter 39 is set so as not take in an input signal (or address signal) in the periods Δt7 and Δt8, which makes it easy to control the noise filter 39.

The effect of removing noise with the noise filter 39 is greater in the asynchronous PSRAM as explained in the first to third embodiments than in the clock synchronization PSRAM as in the fourth embodiment. The reason is that, since the data output timing is known in the synchronous PSRAM, even if a conventional noise filter with a fixed filter length is used, the effect is obtained to some extent. However, the data output timing is indefinite in the asynchronous PSRAM. Therefore, there may be a case where noise can hardly be removed with a conventional noise filter with a fixed length. For this reason, providing the noise filter 39 with a variable filter length as shown in the first to third embodiments particularly produces a prominent effect in the asynchronous PSRAM.

Accordingly, although the fourth embodiment may be applied to the input buffer 18 as in the first to third embodiments, it is more desirable in the synchronous PSRAM that the fourth embodiment should be applied to the input buffer 16 than to the address buffer 16. This produces a greater effect.

Fifth Embodiment

Next, a semiconductor memory device according to a fifth embodiment of the invention will be explained. The fifth embodiment relates to a clock synchronization PSRAM. The fifth embodiment is such that the filter length of the noise filter 39 is controlled according to the operating speed (or clock frequency) of the semiconductor memory device, not according to the capacity of the load or the number of output bits. In the fifth embodiment, a case where the filter length of a noise filter provided in the input buffer 16, not in the address buffer 16, is adjusted will be explained as an example. The reason is that the adjustment of the filter length produces a greater effect in the input buffer than the address buffer 16 in the clock synchronization PSRAM as described in the fourth embodiment.

The block configuration of a PSRAM according to the fifth embodiment is the same as that of FIG. 1. The configuration of the input circuit included in the input buffer 18 is the same as that of FIG. 16 explained in the second embodiment. The configuration of the data output buffer 16 is the same as that of FIG. 2 explained in the first embodiment. As explained in the fourth embodiment, the input buffer 18 takes in a control signal in synchronization with the clock CLK and the data output buffer 15 outputs read data in synchronization with the clock CLK.

FIG. 28 is a circuit diagram of the mode register 20 included in the PSRAM 1 of the fifth embodiment. As shown in FIG. 28, the mode register 20 of the fifth embodiment includes a filter length select circuit 100 and inverters 100 to 103 and the memory device 60 includes a filter length control table 104 in the configuration explained using FIG. 4 in the first embodiment.

Like the filter length control table 70 explained in the second embodiment, the filter length control table 104 is written into the memory device 60 in advance by the user of the PSRAM 1 or in manufacturing the PSRAM 1. In the filter length control signal table 104, control information about filter length control signals FL1 to FL3 according to a speed signal externally input has been stored. In the example of FIG. 28, four signals SMODE1 to SMODE4 are prepared for speed signals. In the filter length control signal table, the following information is stored: when SMODE1 has been input as a speed signal, filter length control signals FL1 to FL3 are all made low; when SMODE2 has been input as a speed signal, filter length control signal FL1 is made high, and FL2 and FL3 are made low; when SMODE3 has been input as a speed signal, filter length control signals FL1 and FL2 are made high, and FL3 is made low; and when SMODE4 has been input as a speed signal, filter length control signals FL1 to FL3 are all made high. The details of the speed signals will be described later.

According to the externally input speed signal, the select circuit 100 reads information about filter length control signals FL1 to FL3 from the filter length control signal table 104 in the memory device 60. Then, according to the read information, the select circuit 100 generates filter length control signals FL1 to FL3. Inverters 101 to 103 invert filter length control signals FL1 to FL3, respectively, thereby generating filter length control signals /FL1 to /FL3.

Figure 29:
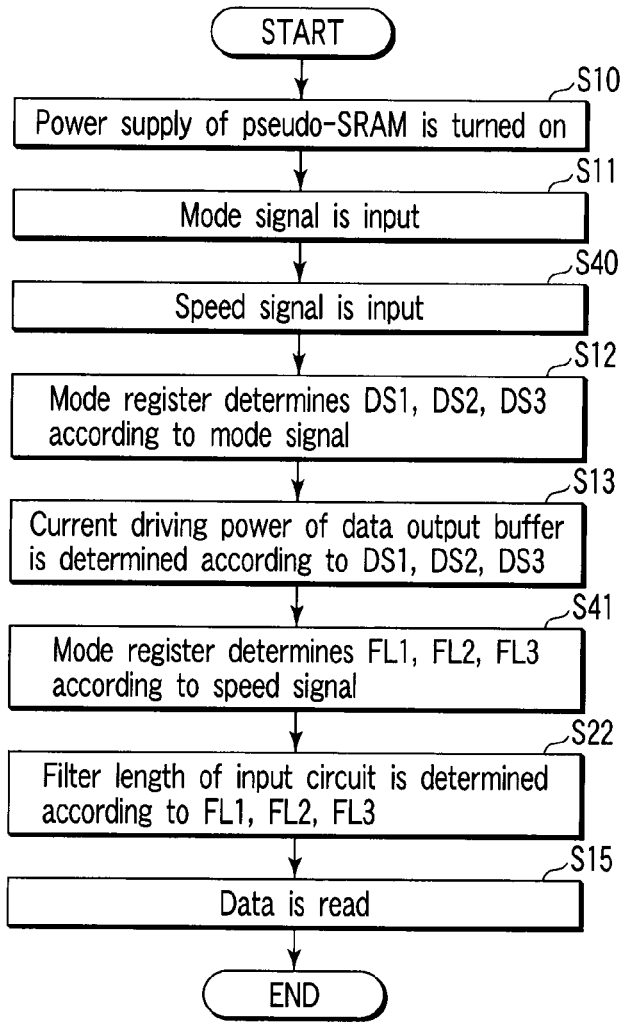
FIG. 29 is a flowchart to help explain the read operation of the PSRAM of the fifth embodiment.

Next, the read operation of the PSRAM 1 with the above configuration will be explained, particularly focusing attention on the input circuit 30 included in the input buffer 28 and the data output buffer 15. FIG. 29 is a flowchart to help explain the read operation.

As shown in FIG. 29, first, the power supply of the PSRAM 1 is turned on (step S10). Next, a mode signal is input (step S11). Then, a speed signal is input (step S40). Any one of signals SMODE1 to SMODE 4 is input as a speed signal. The speed signal indicates the operating speed of the PSRAM 1. More specifically, the speed signal represents the frequency of the operating clock of the PSRAM. For example, in the fifth embodiment, the operating clock frequency of the PSRAM 1 is 54 MHz when SMODE1 is input, 75 MHz when SMODE2 is input, 83 MHz when SMODE3 is input, and 108 MHz when SMODE4 is input.

When the mode signal has been input, the mode register 20 determines drive control signals DS1 to DS3 (step S12). Determining drive control signals DS1 to DS3, /DS1 to /DS3 causes the current driving power of the output circuit 50 to be determined (step S13).

When the speed signal has been input, the mode register 20 determines filter length control signals FL1 to FL3 (step S41). Specifically, according to the input speed signal, the mode register refers to the filter length control signal table 104 and generates filter length control signals FL1 to FL3. At the same time, the mode register generates filter length control signals /FL1 to /FL3. Determining filter length control signals FL1 to FL3, /FL1 to /FL3 causes the filter length of the noise filter 39 to be determined (step S22). That is, with the configuration of FIG. 16, the number of MOS transistors functioning as capacitor elements is determined. Thereafter, data is read from the memory cell MC of the memory cell array 10 (step S15).

The operation of the input circuit 30 according to the speed signal will be explained concretely below. When signal SMODE1 has been input as a speed signal, the mode register 20 sets filter length control signal FL1=Low, FL2=Low, and FL3=Low. Accordingly, in the configuration of FIG. 16, none of MOS transistors in the noise filter 39 function as capacitor elements. That is, the filter length is zero.

Next, when signal SMODE2 has been input as a speed signal, the mode register 20 sets filter length control signal FL1=High, FL2=Low, and FL3=Low. Accordingly, MOS transistors 43, 44, 46, 47 do not function as capacitor elements. Only MOS transistors 42, 45 function as capacitor elements. This is the same as when mode signal MODE1 has been input in the first embodiment. Accordingly, the filter length is set to the shortest Δt1.

Next, when signal SMODE3 has been input as a speed signal, the mode register 20 sets filter length control signal FL1=High, FL2=High, and FL3=Low. Accordingly, MOS transistors 44, 47 do not function as capacitor elements. MOS transistors 42, 43, 45, 46 function as capacitor elements. This is the same as when mode signal MODE2 has been input in the first embodiment. Accordingly, the filter length is set to Δt2 (>Δt1).

Next, when signal SMODE4 has been input as a speed signal, the mode register 20 sets filter length control signal FL1=High, FL2=High, and FL3=High. Accordingly, all of MOS transistors 42 to 47 function as capacitor elements. This is the same as when mode signal MODE3 has been input in the first embodiment. Accordingly, the filter length is set to Δt3 (>Δt2).

In the fifth embodiment, too, the filter length is set to any one of zero, Δt1, Δt2, and Δt3 by filter length control signals FL1 to FL3. The fifth embodiment differs from the first embodiment in that the filter length is controlled by the speed signal, not by the mode signal. The current driving power of the output circuit 50 is controlled by the mode signal and its operation is the same as in the first embodiment.

As described above, the PSRAM of the fifth embodiment produces the effect in item (5) described below.

(5) The noise resistance of the PSRAM can be improved, while the operating speed of the PSRAM is being improved (part 4).

With the configuration of the fifth embodiment, the filter length of the noise filter 39 is controlled by the speed signal. In other words, the filter length is controlled according to the data output speed (or clock frequency) of the data output buffer 15. Therefore, the noise resistance can be improved, while the operating speed of the PSRAM is being improved. The effect will be explained in detail below.

Figure 30:
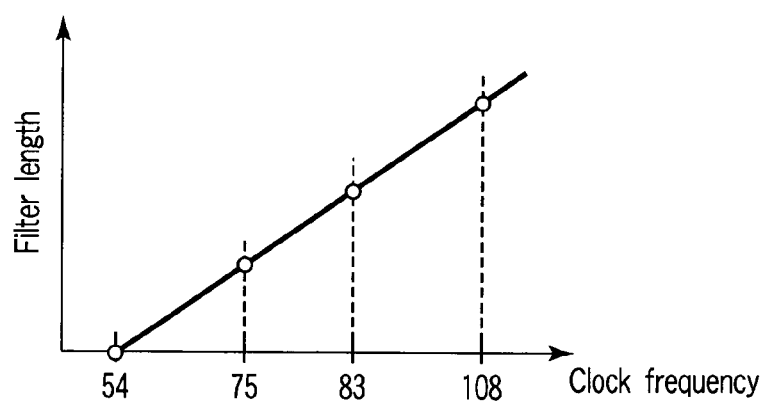
FIG. 30 is a graph showing a change in the filter length and a change in the current driving power with respect to the clock frequency in the PSRAM of the fifth embodiment.

FIG. 30 is a graph showing the relationship between the clock frequency and the filter length in the PSRAM of the fifth embodiment. Generally, as the operating speed increases, power-supply noise also increases. With the configuration of the fifth embodiment, as the operating speed increases, the length of the noise filter 39 is increased as shown in FIG. 30. That is, since the chances are high that noise will be large when the operating clock frequency of the PSRAM is high, the filter length of the noise filter 39 is made greater. On the other hand, when the frequency is low, noise is small in most cases. Thus, the filter length of the noise filter 39 is made shorter. That is, according to the magnitude of noise to occur, the filter length of the noise filter 39 is varied. Accordingly, as explained using FIG. 15 in the first embodiment, the filter length can be set to the adequate value without lengthening the filter length unnecessarily to lower the operating speed or making the filter length unnecessarily short to decrease the noise resistance. As a result, the noise resistance can be improved, while the operating speed of the PSRAM is being improved.

Although it is desirable to apply the fifth embodiment to the input circuit 30 in the input buffer 18 in the synchronous PSRAM, it may be applied to the input circuit 30 in the address buffer 16.

Sixth Embodiment

Next, a semiconductor memory device according to a sixth embodiment of the invention will be explained. Like the fifth embodiment, the sixth embodiment relates to a clock synchronization PSRAM. The sixth embodiment is such that the speed signal is related to drive control signals DS1 to DS3 to control the filter length of the noise filter 39 and the current driving power of the output circuit 50 by the speed signal.

Figure 31:
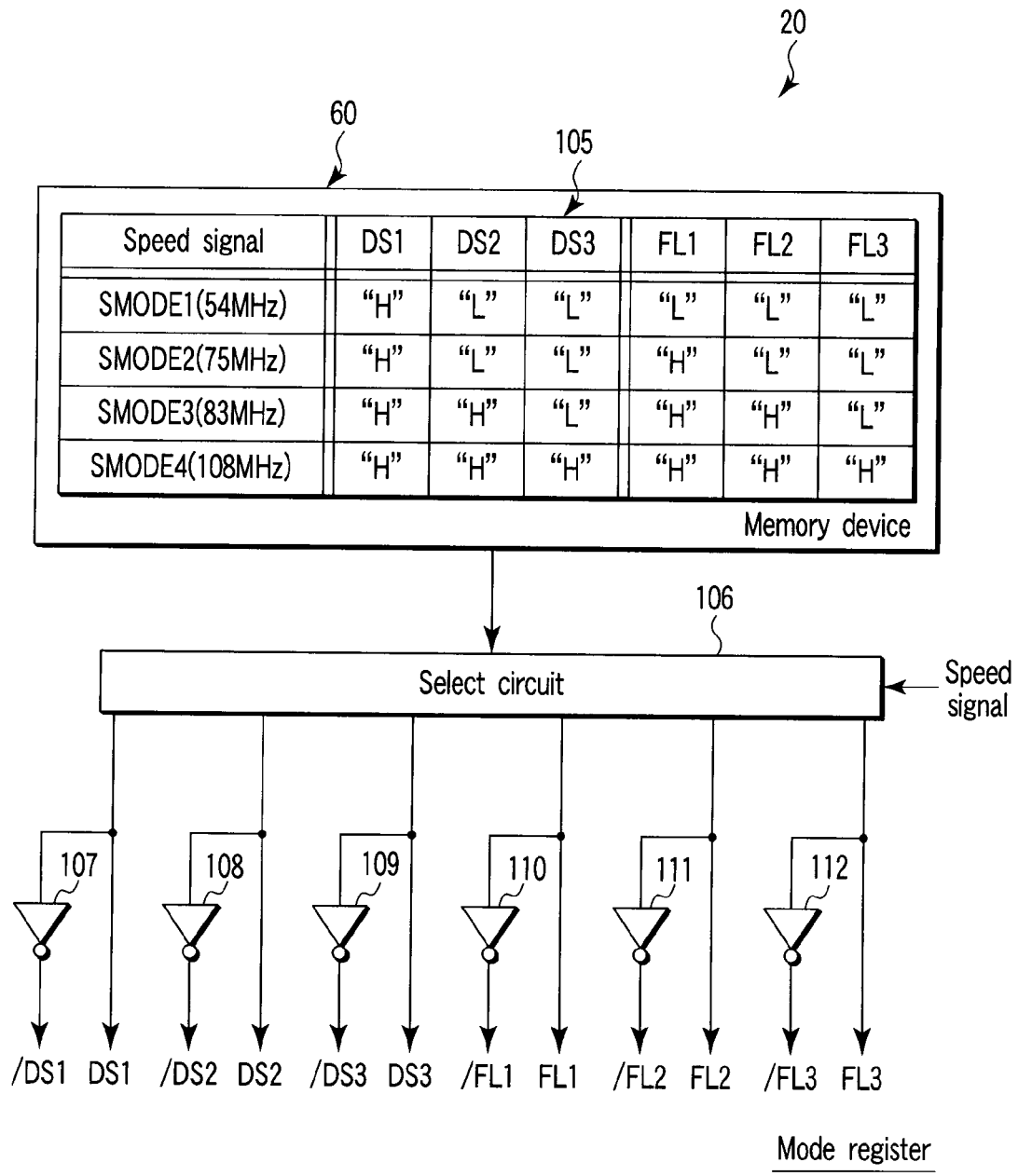
FIG. 31 is a circuit diagram of a mode register according to a sixth embodiment of the invention.

The block configuration of the PSRAM 1 of the sixth embodiment is the same as that of FIG. 1 explained in the first embodiment, except that a speed signal is input in place of the mode signal. The input circuit included in the input buffer 18 has the same configuration as that of FIG. 16 explained in the second embodiment. The data output buffer 15 has the same configuration as that of FIG. 3 explained in the first embodiment. FIG. 31 is a circuit diagram of a mode register 20 according to the sixth embodiment.

As shown in FIG. 31, the mode register 20 includes a memory device 60, a select circuit 106, and inverters 107 to 112. As explained in the first embodiment, the memory device 60 is a semiconductor memory, such as a DRAM or a flash memory, and holds a control signal table 105. The control signal table 105 is written into the memory device 60 in advance by the user of the PSRAM 1 or in manufacturing the PSRAM 1. The control signal table 105 of the sixth embodiment differs from the table 61 of the first embodiment in that the control signal table 105 stores control information on the drive control signals DS1 to DS3 and the filter length control signals FL1 to FL3 according to the speed signal. In the example of FIG. 31, four signals SMODE1 to SMODE4 are prepared for speed signals. The meanings of SMODE1 to SMODE4 are as explained in the fifth embodiment. In the control signal table, the following information is stored: when SMODE1 and SMODE2 have been input, drive control signal DS1 is made high, and DS2 and DS3 are made low; when SMODE3 has been input, drive control signals DS1 and DS2 are made high, and DS3 is made low; and when SMODE4 has been input, drive control signals DS1 to DS3 are all made high. The relationship between SMODE1 to SMODE4 and filter control signals FL1 to FL3 is the same as in the fifth embodiment.

According to the externally input speed signal, the select circuit 106 reads information about drive control signals DS1 to DS3 and filter length control signals FL1 to FL3 from the control signal table 106 in the memory device 60. Then, according to the read information, the select circuit 106 generates drive control signals DS1 to DS3 and filter length control signals FL1 to FL3. Inverters 107 to 109 invert drive control signals DS1 to DS3, respectively, thereby generating drive control signals /DS1 to /DS3. Inverters 110 to 112 invert filter length control signals FL1 to FL3, respectively, thereby generating filter length control signals /FL1 to /FL3.

Figure 32:
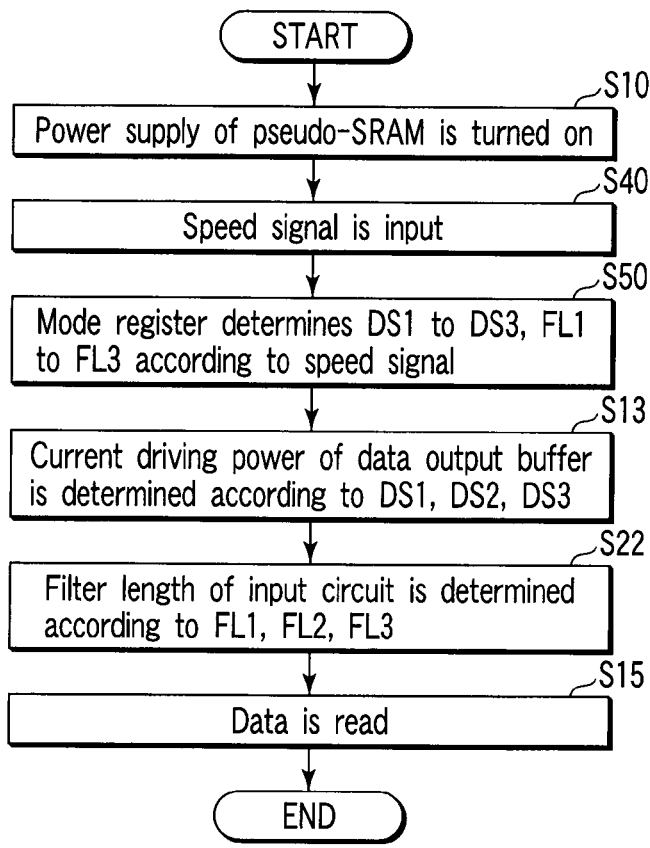
FIG. 32 is a flowchart to help explain the read operation of the PSRAM of the sixth embodiment.

Next, the read operation of the PSRAM 1 with the above configuration will be explained, particularly focusing attention on the input circuit 30 of the input buffer 18 and the output circuit 50. FIG. 32 is a flowchart to help explain the read operation.

As shown in FIG. 32, first, the power supply of the PSRAM 1 is turned on (step S10). Next, a speed signal is input (step S40). When a speed signal has been inputted, the mode register 20 determines drive control signals DS1 to DS3 and filter length control signals FL1 to FL3 (step S50). Specifically, the mode register refers to the control signal table 105 and generates drive control signals DS1 to DS3 and filter length control signals FL1 to FL3 according to the input speed signal. At the same time, the mode register generates drive control signals /DS1 to /DS3 and filter length control signals /FL1 to /FL3.

Determining drive control signals DS1 to DS3, /DS1 to /DS3 causes the current driving power of the output circuit 50 to be determined (step S13). That is, in the configuration of FIG. 3, the number of MOS transistors to be turned on is determined. Moreover, determining filter length control signals FL1 to FL3, /FL1 to /FL3 causes the filter length of the noise filter 39 of the input circuit 30 in the input buffer 28 to be determined (step S22). That is, in the configuration of FIG. 16, the number of MOS transistors to function as capacitor elements in the noise filter 39 is determined. Thereafter, data is read from the memory cell MC of the memory cell array 10 (step S15).

As described above, the PSRAM of the sixth embodiment produces the effect in item (6) described below.

(6) The noise resistance of the PSRAM can be improved, while the operating speed of the PSRAM is being improved (part 5).

With the configuration of the sixth embodiment, the filter length of the noise filter 39 and the current driving power of the output circuit 50 are controlled by the speed signal. Therefore, the noise resistance can be improved, while the operating speed of the PSRAM is being improved. The effect will be explained in detail below.

Figure 33:
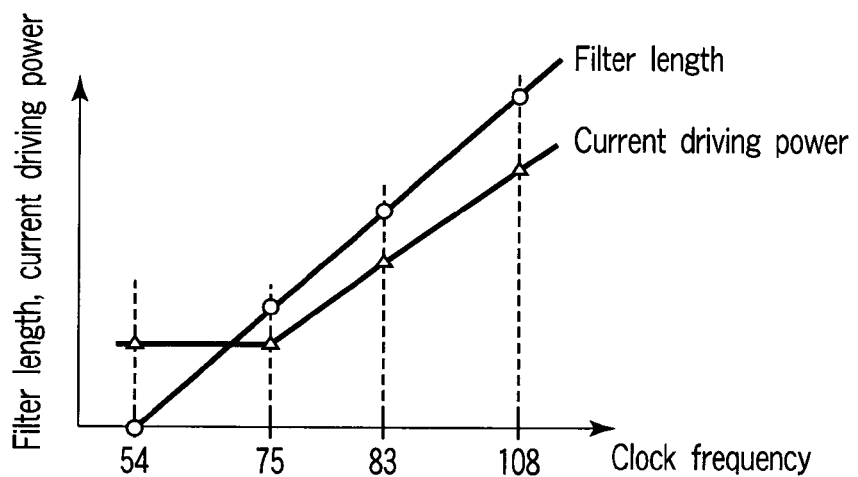
FIG. 33 is a graph showing a change in the filter length and a change in the current driving power with respect to the clock frequency in the PSRAM of the sixth embodiment.

FIG. 33 is a graph showing the relationship between the filter length and current driving power and the operating clock frequency in the PSRAM of the sixth embodiment. The abscissa indicates the operating clock frequency and the ordinate indicates the filter length of the noise filter 39 and the current driving power of the output circuit 50. As described above, as the clock frequency increases, power-supply noise increases. Therefore, in the sixth embodiment, as the clock frequency increases, the filter length of the noise filter 39 is made greater. This produces the effect in item (5) explained in the fifth embodiment.

Furthermore, there may be a case where the current driving power has to be increased as the clock frequency increases. In this case, controlling the current driving power by the speed signal as in the sixth embodiment enables the configuration of the mode register 20 to be simplified.

Figure 34:
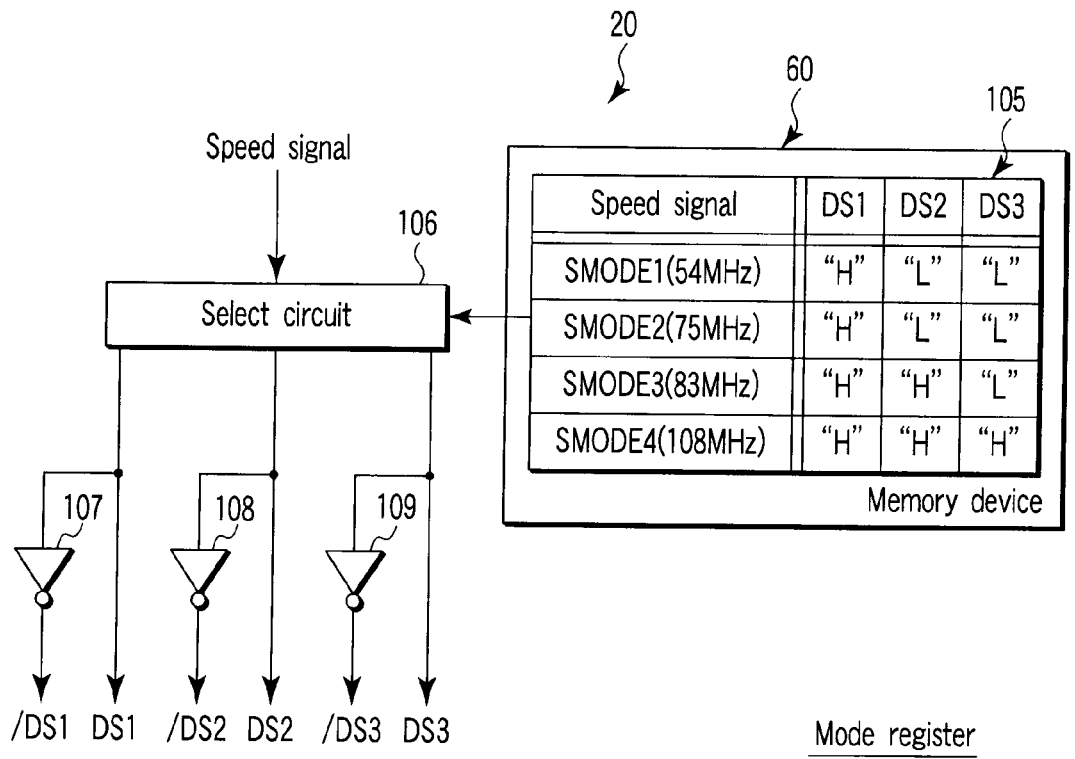
FIG. 34 is a circuit diagram of a mode register according to a modification of the sixth embodiment.
Figure 35:
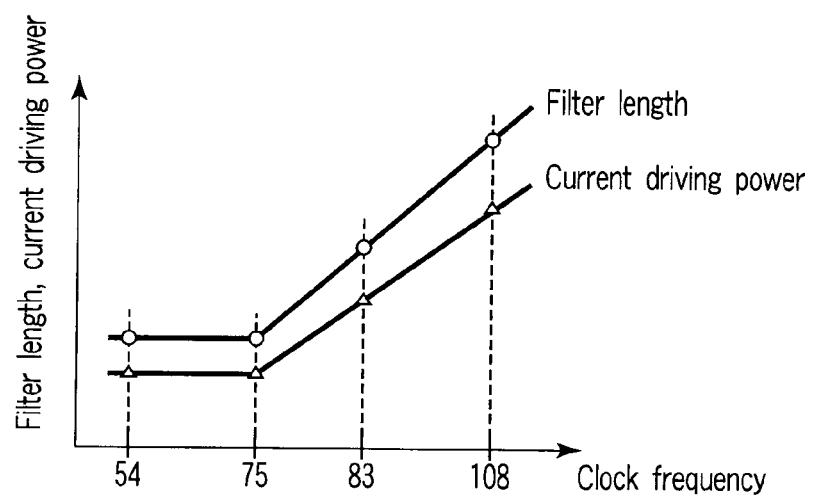
FIG. 35 is a graph showing a change in the filter length and a change in the current driving power with respect to the clock frequency in the PSRAM according to a modification of the sixth embodiment.

As in the third embodiment, in the sixth embodiment, the filter length may be controlled by the drive control signal, eliminating the filter length control signal. In this case, the noise filter 39 has the same configuration as that of FIG. 2 and the mode register 20 has the same configuration as that of FIG. 34. As shown in FIG. 34, the control signal table 105 holds information on drive control signals DS1 to DS3 and needs no information on filter length control signals FL1 to FL3. The select circuit 106 refers to the control signal table 105 and generates drive control signals DS1 to DS3. In this case, the filter length and current driving power change as shown in FIG. 35.

Although it is desirable to apply the sixth embodiment to the input circuit 30 in the input buffer 18 in the synchronous PSRAM, it may be applied to the input circuit 30 in the address buffer 16.

Seventh Embodiment

Figure 36:
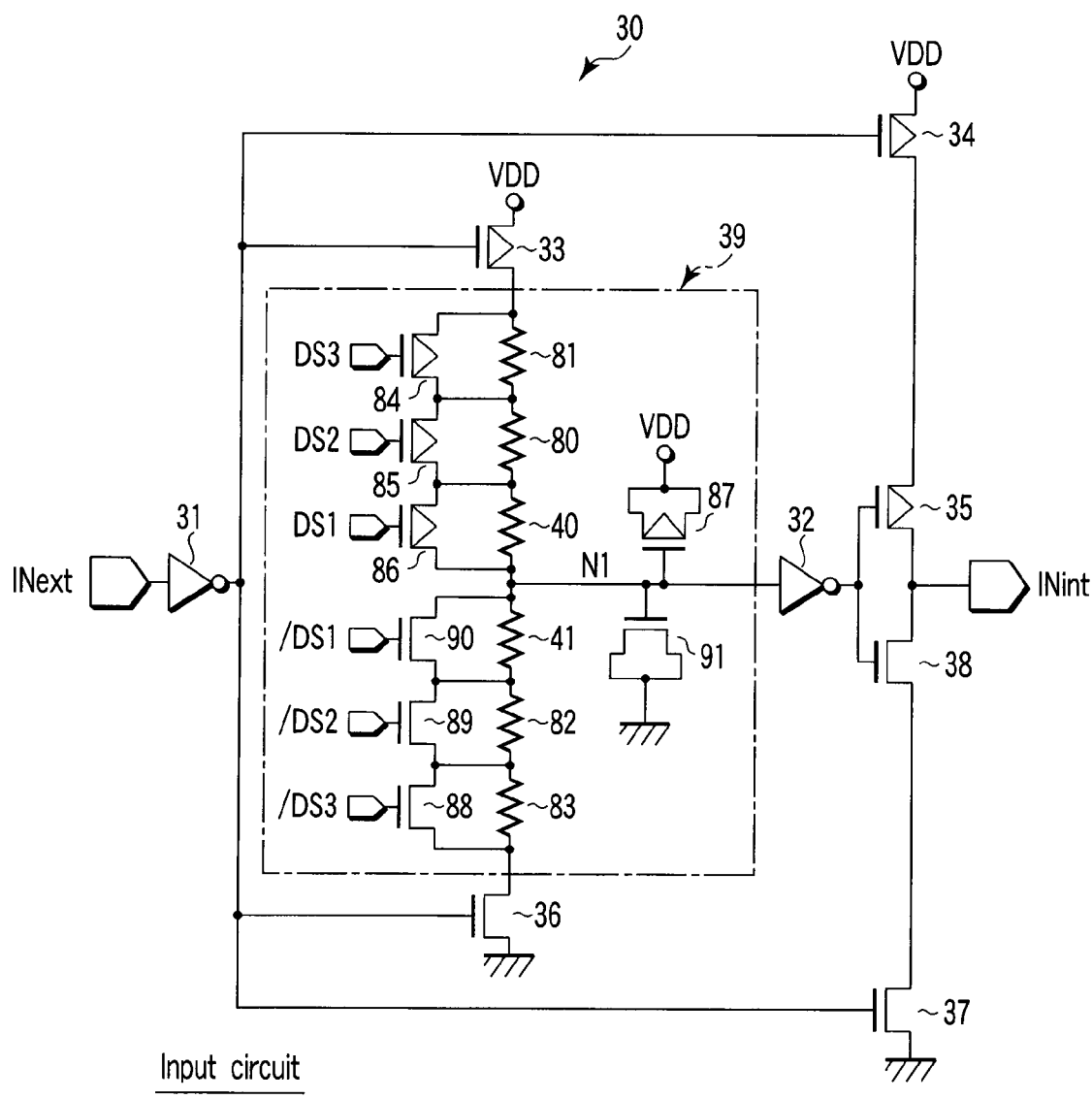
FIG. 36 is a circuit diagram of an input circuit included in a PSRAM according to a seventh embodiment of the invention.

Next, a semiconductor memory device according to a seventh embodiment of the invention will be explained. The seventh embodiment is such that the filter length of the input buffer 18 and/or address butter 16 is changed according to the resistance of the RC circuit in the noise filter 39. FIG. 36 is a circuit diagram of the input circuit 30 in the address buffer 16 and/or input buffer 18 included in the PSRAM 1 according to the seventh embodiment.

As shown in FIG. 36, the configuration of the input circuit 30 is such that MOS transistors 42 to 47 are eliminated in the configuration of FIG. 2 explained in the first embodiment and resistance elements 80 to 83, p-channel MOS transistors 84 to 87, and n-channel MOS transistors 88 to 91 are newly added.

Resistance elements 80, 81 are connected in series between one end of resistance element 40 and the drain of MOS transistor 33. One end of resistance element 80 is connected to one end of resistance element 40. The other end of resistance element 80 is connected to one end of resistance element 81. The other end of resistance element 81 is connected to the drain of MOS transistor 33. MOS transistor 84 has its source connected to the other end of resistance element 81 and its drain connected to one end of resistance element 81. A drive control signal DS3 is input to the gate of MOS transistor 84. MOS transistor 85 has its source connected to the other end of resistance element 80 and its drain connected to one end of resistance element 80. A drive control signal DS2 is input to the gate of MOS transistor 85. MOS transistor 86 has its source connected to one end of resistance element 40 and its drain connected to the other end of resistance element 40. A drive control signal DS1 is input to the gate of MOS transistor 86.

Resistance elements 82, 83 are connected in series between one end of resistance element 41 and the drain of MOS transistor 36. One end of resistance element 82 is connected to one end of resistance element 41. The other end of resistance element 82 is connected to one end of resistance element 83. The other end of resistance element 83 is connected to the drain of MOS transistor 36. MOS transistor 88 has its source connected to the other end of resistance element 83 and its drain connected to one end of resistance element 83. A drive control signal /DS3 is input to the gate of MOS transistor 88. MOS transistor 89 has its source connected to the other end of resistance element 82 and its drain connected to one end of resistance element 82. A drive control signal /DS2 is input to the gate of MOS transistor 89. MOS transistor 90 has its source connected to one end of resistance element 41 and its drain connected to the other end of resistance element 41. A drive control signal /DS1 is input to the gate of MOS transistor 90.

MOS transistor 87 has its gate connected to node N2 and its source and drain connected to each other to form a common junction. A power supply voltage VDD is applied to the common junction. MOS transistor 91 has its gate connected to node N1 and its source and drain connected to each other to form a common junction, which is grounded. That is, MOS transistors 87, 91 function as capacitor elements.

When the seventh embodiment is applied to the second, fifth, and sixth embodiments, drive control signals DS1 to DS3, /DS1 to /DS3 are replaced with filter control signals FL1 to FL3, /FL1 to /FL3.

With the above configuration, when DS1=High, DS2=Low, and DS3=Low (for example, when MODE1 has been input), MOS transistors 84, 85, 89, 88 are turned on. That is, both ends of resistance elements 80, 81, 82, 83 are short-circuited by the current paths of those MOS transistors. As a result, in the noise filter 39, resistance elements 40, 41 and MOS transistors 87, 91 form an RC circuit.

Moreover, when DS1=High, DS2=High, and DS3=Low (for example, when MODE2 has been input), MOS transistors 84, 88 are turned on. That is, both ends of resistance elements 81, 83 are short-circuited by the current paths of those MOS transistors. As a result, in the noise filter 39, resistance elements 40, 41, 80, 92 and MOS transistors 87, 91 form an RC circuit.

Then, when DS1=High, DS2=High, and DS3=High (for example, when MODE3 has been input), all of MOS transistors 84 to 86, 88 to 90 are turned off. As a result, in the noise filter 39, resistance elements 40, 41, 80 to 83 and MOS transistors 87, 91 form an RC circuit.

Figure 37:
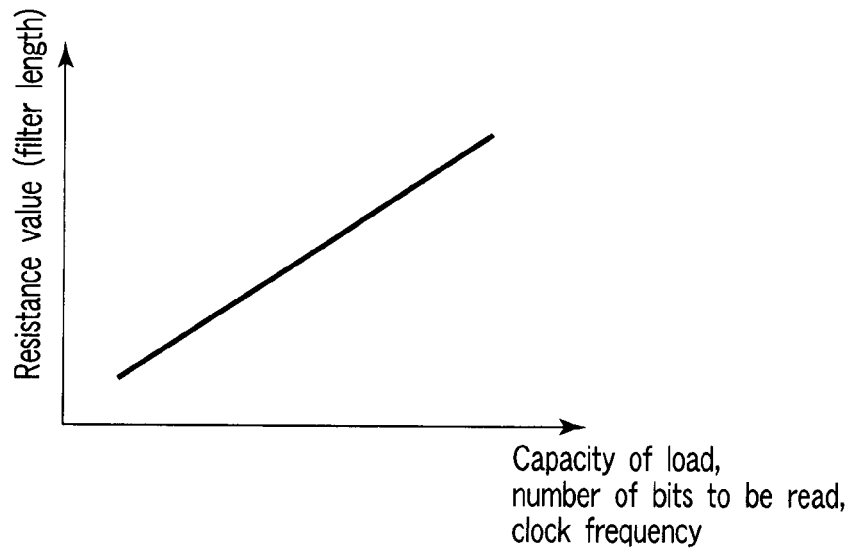
FIG. 37 is a graph showing a change in the resistance with respect to the load carrying capacity, the number of bits to be read, and the clock frequency in a noise filter included in a PSRAM according to a modification of the seventh embodiment.

As described above, the resistance of the RC circuit in the noise filter 39 varies according to the MODE signal, that is, the capacity of the load connected to the PSRAM. Moreover, as in the second and third embodiments, when the filter length is controlled by the BMODE signal, the resistance of the RC circuit varies according to the number of output bits. Furthermore, as in the fifth and sixth embodiments, when the filter length is controlled by the SMODE signal, the resistance of the RC circuit varies according to the clock frequency. FIG. 37 shows a change in the resistance of the RC circuit in the noise filter 39 with respect to the capacity of the load, the number of bits to be read, and the clock frequency. As shown in FIG. 37, as the capacity of the load increases, the number of bits to be read increases. Alternatively, the clock frequency increases, the resistance of the RC circuit increases. As a result, the delay time in the RC circuit becomes longer, making the filter length greater. Thus, the configuration of the seventh embodiment produces the effects explained in the first to sixth embodiments.

Eighth Embodiment

Figure 38:
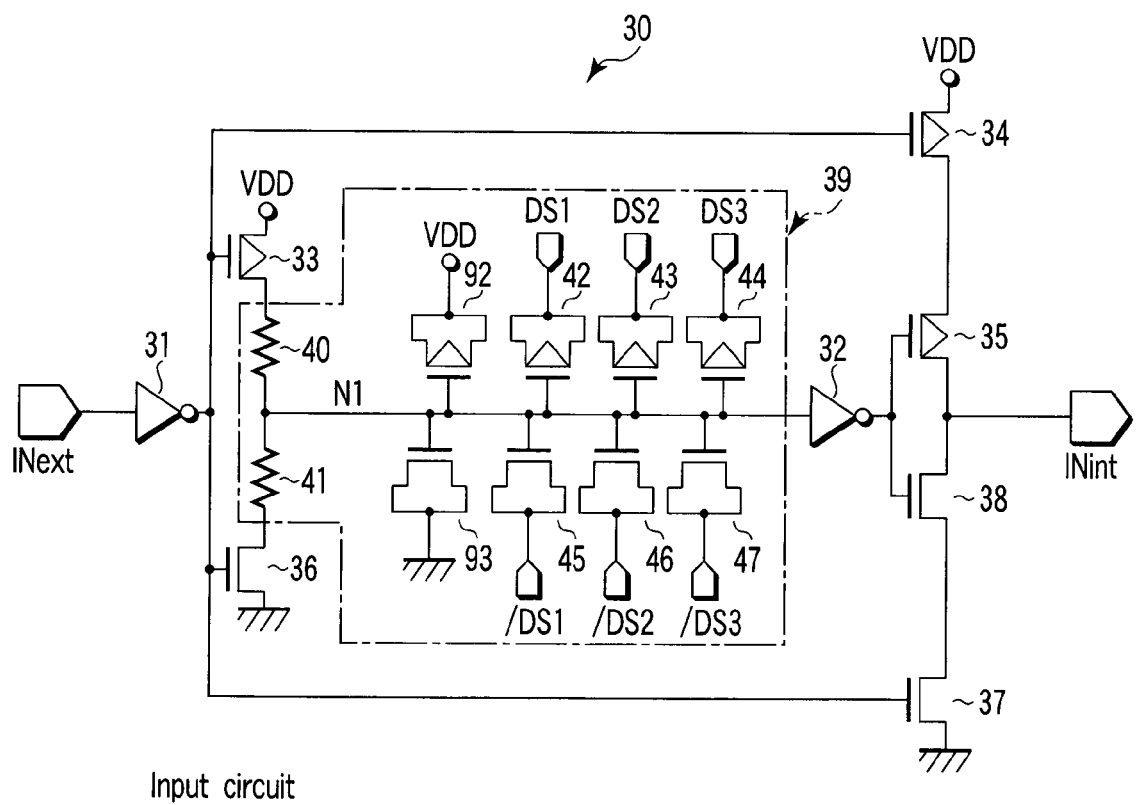
FIG. 38 is a circuit diagram of an input circuit included in a PSRAM according to an eighth embodiment of the invention.

Next, a semiconductor memory device according to an eighth embodiment of the invention will be explained. The eighth embodiment is such that a default value of the filter length is set in the first to seventh embodiments. FIG. 38 is a circuit diagram of the input circuit 30 in the address buffer 16 and/or input buffer 18 according to the eighth embodiment. In FIG. 38, drive control signals DS1 to DS3, /DS1 to /DS3 may be replaced with filter length control signals FL1 to FL3, /FL1 to /FL3.

As shown in FIG. 38, the input circuit 30 of the eighth embodiment has the same configuration as that of FIG. 2 explained in the first embodiment and further includes a p-channel MOS transistor 92 and an n-channel MOS transistor 93. MOS transistor 92 has its gate connected to node N1 and its source and drain connected to each other to form a common junction, to which the power supply voltage VDD is applied. MOS transistor 93 has its gate connected to node N1 and its source and drain connected to each other to form a common junction, which is grounded.

With the above configuration, MOS transistors 92, 93 always function as capacitor elements, regardless of drive control signals DS1 to DS3, /DS1 to /DS3. Accordingly, the default value of the filter length of the noise filter 39 can be set suitably according to the size of MOS transistors 92, 93, that is, the capacity of the capacitance elements composed of MOS transistors 92, 93.

FIG. 39 is a circuit diagram of the input circuit 30, showing the configuration where the default value of the filter length is set according to the resistance. As shown in FIG. 39, the input circuit 30 has the same configuration as that of FIG. 36 explained in the seventh embodiment and further includes resistance elements 94, 95. Resistance element 94 has one end connected to node N1 and the other end connected to the other end of resistance element 40. Resistance element 95 has one end connected to node N1 and the other end connected to resistance element 41.

With the above configuration, resistance elements 94, 95 are not short-circuited, regardless of drive control signals DS1 to DS3, /DS1 to /DS3. Thus, the default value of the filter length of the noise filter 39 can be set suitably according to the resistance of resistance elements 94, 95. The default value can be determined by a noise test in the test mode conducted before the shipment of the PSRAM. That is, a check is made for noise occurred under a plurality of operating conditions to figure out the required minimum filter length. Then, the resistance of the resistance element, or the size of MOS transistors 92, 93, is determined so as to meet the required minimum filter length.

As described above, with the semiconductor memory devices according to the first to eighth embodiments, the filter length of the noise filter 39 provided in the input circuit 30 of the address buffer 16 and/or input buffer 18 is varied according to the data output capability of the data output buffer 15. The output capability is, for example, the current driving power of the output circuit 50 (or the capacity of the load connected to the output data buffer), the number of bits output from the output data buffer, or the output speed of the data output buffer (or the operating speed of the semiconductor memory device). That is, when the load capacity, the number of bits, or the operating speed increases and noise is liable to occur, the filter length of the noise filter 39 is made greater. Conversely, when the load capacity, the number of bits, or the operating speed decreases and noise is less liable to occur, the filter length of the noise filter 39 is made shorter. By doing this, the noise filter 39 can be set to the optimum value on a case-by-case basis, which prevents the filter length from being made greater unnecessarily to decrease the operating speed.

In the above embodiments, the case where the filter length of the noise filter 39 in the address buffer 16 and input buffer 18 is controlled has been explained as an example. However, the embodiments may be applied to not only the address buffer 16 and input buffer 18 but also a general input circuit, provided that not only external input signals input at the same time that the data is output, or address signals and control signals, but also externally input general signals are input to the input circuit. Moreover, the capacitance ratio of MOS transistors 42, 43, 44, the capacitance ratio of MOS transistors 45, 46, 47, the resistance ratio of resistance elements 40, 80, 81, and the resistance ratio of resistance elements 41, 82, 83 in the noise filter 39 are, for example, 1:1:2. Of course, this value may be set suitably. Although the filter length has been changed in a linear function manner in FIGS. 22, 25, 30, and 33, it may be changed according to a high-dimensional function equal to or higher than a quadratic function.

In the above embodiments, each of the tables 61, 70, 71, 104, 105 has held the control signals DS1 to DS3, FL1 to FL3 themselves. However, each table has only to hold information on the required current driving power or filter length. In this case, each of the select circuits 61, 66, 72, 100, 106 generates control signals DS1 to DS3, FL1 to FL3 so as to satisfy the current driving power or filter length read from the table.

Figure 40:
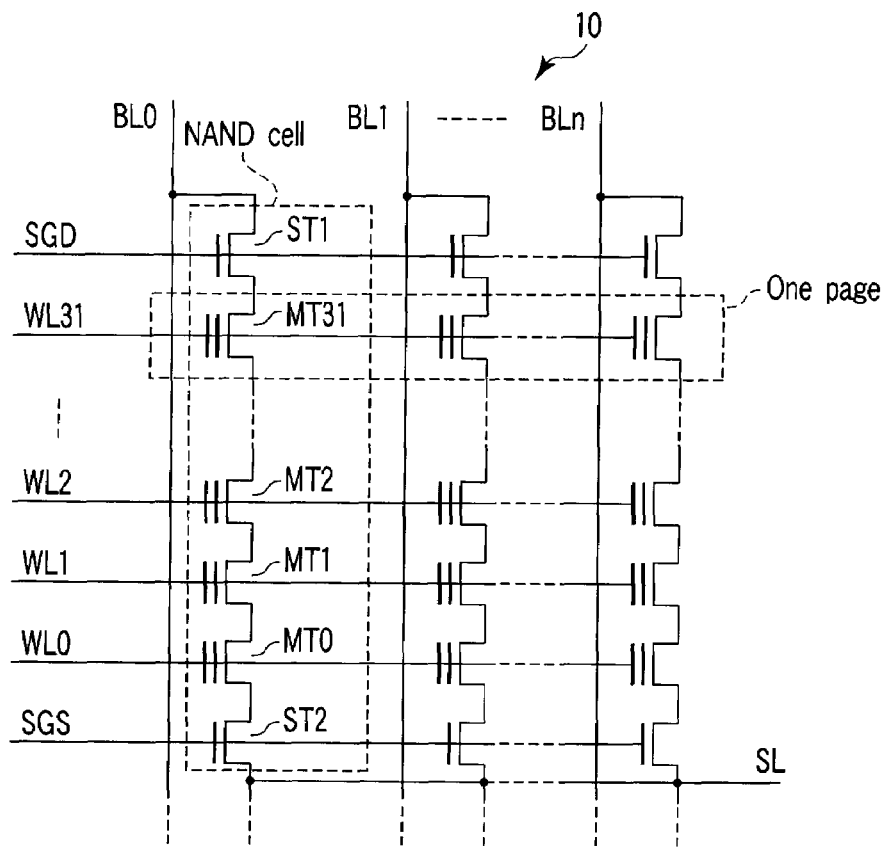
FIG. 40 is a circuit diagram of a memory cell array of a NAND flash memory.

Furthermore, in the above embodiments, a PSRAM has been explained as an example of the semiconductor memory device. The invention is not restricted to a PSRAM and may be applied to, for example, an EEPROM. FIG. 40 is a circuit diagram of the memory cell array of a NAND flash memory. As shown in FIG. 40, the memory cell array has a plurality of NAND cells. Although only one row of NAND cells is shown in FIG. 40, there may be a plurality of rows. Each of the NAND cells includes 32 memory cell transistors MT0 to MT31 and select transistors ST1, ST2. Hereinafter, to simplify the explanation, the memory cell transistors MT0 to MT31 are simply referred to as memory cell transistors MT. Each of the memory cell transistors MT has a stacked gate structure which has a charge accumulation layer (for example, floating gate) formed on a semiconductor substrate with a gate insulating film interposed therebetween and a control gate formed on the floating gate with an inter-gate insulating film interposed therebetween. The number of memory cell transistors MT is not limited to 32 and may be 8 or 16. The number of memory cell transistors MT is not restricted. Adjacent ones of the memory cell transistors MT share the source and drain. The memory cell transistors MT are arranged in such a manner that their current paths are connected in series between the select transistors ST1, ST2. The drain region at one end of the memory cell transistors MT connected in series is connected to the source region of the select transistor ST1. The source region at the other end of the memory cell transistors MT connected in series is connected to the drain region of the select transistor ST2.

The control gates of the memory cell transistors MT in the same row are connected equally to any one of word line WL0 to word line WL31. The gates of the select transistors ST1 of the memory cells in the same row are connected equally to the select gate line SGD. The gates of the select transistors ST2 of the memory cells in the same row are connected equally to the select gate line SGS. Moreover, the drains of the select transistors ST1 in the same column in the memory cell array are connected equally to any one of bit line BL0 to bit line BLn (n is a natural number). The sources of the select transistors ST2 are connected equally to a source line SL.

Figure 41:
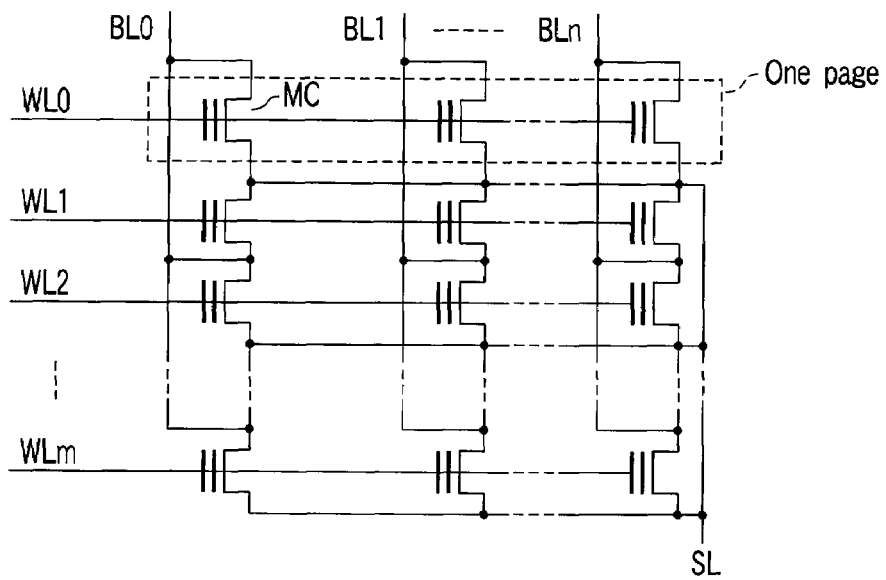
FIG. 41 is a circuit diagram of a memory cell array of a NOR flash memory.

FIG. 41 is a circuit diagram of the memory cell array of a NOR flash memory. As shown in FIG. 41, the memory cell array 20 includes ((m+1)×(n+1)) memory cells MC (m and n are natural numbers). A memory cell MC is a MOS transistor which has a stacked gate including a charge accumulation layer (e.g., a floating gate) and a control gate. The control gates of the memory cells MC in the same row are connected equally to any one of word line WL0 to word line WLm. The drains of the memory cells MC in the same column are connected equally to any one of bit line BL0 to bit line BLn. The sources of the memory cells MC are connected equally to the same source line SL.

The above embodiments may be applied even to the flash memory described above. Moreover, the above embodiments may be applied to not only the flash memory but also the semiconductor memory in general, including a DRAM.

In the above embodiments, the mode signal, bit length signal, and speed signal have been input directly to the mode register 20 as shown in, for example, FIG. 1. However, these signals may be input to the semiconductor memory device 1 by using address pins that enable the address buffer 16 to accept the address signal. The address signal is, for example, 8-bit data and therefore eight address pins are prepared. In this case, after the power supply is turned on, 8-bit data serving as the mode signal, bit length signal, or speed signal are input to the address pins. Then, after the current driving power of the data output buffer 15 and the filter length of the noise filter 39 have been determined, 8-bit data serving as an address signal are input to the address pins. That is, the 8-bit data input to the address pins mean the mode signal, bit length signal, or speed signal after the turning on of the power supply. Thereafter, the 8-bit data means the address signal. This will be explained in detail using FIG. 42. FIG. 42 is a flowchart to help explain the flow of processing in the semiconductor memory device 1, focusing attention on the 8-bit data input to the address pins. While a case where the 8-bit data is the mode signal has been shown in FIG. 42, the same holds true for the bit length signal or speed signal.

As shown in FIG. 42, first, when the power supply of the PSRAM 1 is turned on (step S10), the mode register 20 detects this and goes into a first state (step S60). The first state is a state where the mode signal can be accepted. Then, 8-bit data are externally input to the address pins (step S61). The 8-bit data input at this moment is a mode signal, not an address signal (step S62). Then, the address buffer 16 recognizes that the 8-bit data is a mode signal from the fact that the mode register 20 is in the first state.

Then, the address buffer 16 transfers the 8-bit data input from the address pins to the mode register 20 (step S63). On the basis of the given 8-bit data, the mode register 20 determines the current driving power of the data output buffer 15 and the filter length of the noise filter 39 (step S64). MODE1 to MODE3 can be distinguished using the low-order 2 bits of the 8-bit data. Specifically, in FIG. 4, when the low-order 2 bits in the 8-bit data are "00," this corresponds to a case where mode signal MODE1 has been input. When the low-order 2 bits are "01," this correspond to a case where mode signal MODE2 has been input. When the low-order 2 bits are "10," this correspond to a case where mode signal MODE3 has been input. The corresponding state can be set variously.

After determining the current driving power and filter length, the mode register 20 goes into a second state (step S65). The second state is a state where the address buffer 16 and data output buffer 15 are operated according to the determined current driving power and filter length. Then, 8-bit data are externally input to the address pins (step S66). The 8-bit data input at this moment is an address signal, not a mode signal (step S67). Then, the address buffer 16 recognizes that the 8-bit data is an address signal from the fact that the mode register 20 is in the second state.

Then, the address butter 16 transfers the 8-bit data input from the address pins to the address register 17, not the mode register 20 (step S68). Receiving the 8-bit data, the address register 17 outputs the row address and column address obtained from the 8-bit data to the row decoder 11 and column decoder 13. Then, the data is read from the memory cell array 10 (step S15).

As described above, the mode signal, bit length signal, and speed signal can be input from the address pins by using the 8-bit data shared with the address signal. Of course, the 8-bit data may be shared with not only the address signal but also data. That is, if the input data is 8-bit data, eight data input pins are provided. Then, the mode signal, bit line signal, and speed signal may be input to the data input pins by using the 8-bit data shared with the input data.

Furthermore, the mode signal, bit line signal, and speed signal may be input to the semiconductor memory device 1 by using both the 8-bit data used as the input data and the 8-bit data used as the address signal. That is, when the mode signal, bit line signal, and speed signal are represented in two bits, they may be input to the semiconductor memory device 1 by using one bit in the 8-bit data shared with the input data and one bit in the 8-bit data shared with the address signal.

Of course, the mode signal, bit line signal, and speed signal may be input to the semiconductor memory device 1 separately from the address signal and input data and then special input pins and a special input buffer circuit may be provided. That is, a suitable method may be selected.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array which includes a plurality of memory cells holding data;
   an output buffer circuit which outputs data read from the memory cells; and
   an input buffer circuit which receives an address signal for the memory cells and includes a noise filter to remove noise, the filter length of the noise filter being variable according to the output capability of the data in the output buffer circuit.

2. The semiconductor memory device according to claim 1, wherein the output buffer circuit includes MOS transistors each of which is controlled independently and each of which supplies current to an output node of the output buffer circuit,
   the output capability in the output buffer circuit is a current driving power of the output buffer circuit, and
   the filter length of the noise filter is made greater as the number of MOS transistors to be turned on increases.

3. The semiconductor memory device according to claim 1, wherein the data read from the memory cells is multi-bit data,
the output buffer circuit includes a plurality of output circuits each of which outputs any one of the bits in the data,
as many of the output circuits as the number of bits in the data read are brought into an operating state,
the output capability in the output buffer circuit is the number of bits in the data output by the output buffer circuit, and
the filter length of the noise filter is made greater as the number of output circuits brought into the operating state increases.

4. The semiconductor memory device according to claim 1, wherein the output buffer circuit outputs the data in synchronization with a clock signal,
the output capability in the output buffer circuit is data output speed of the output buffer circuit, and
the length of the noise filter is made greater as a frequency of the clock signal increases.

5. The semiconductor memory device according to claim 1, wherein the noise filter includes a resistance element provided in a transmission path through which the address signal received is transmitted and a plurality of MOS transistors each of which has a source or a drain connected to the transmission path, and
the filter length is varied according to the number of MOS transistors to be turned on.

6. The semiconductor memory device according to claim 1, wherein the noise filter includes a plurality of resistance elements connected in series in a transmission path through which the address signal received is transmitted, and a MOS transistor having a source or a drain connected to the transmission path,
the MOS transistor short-circuits both ends of at least one of the resistance element, and
the filter length is varied according to the number of resistance elements both ends of which are short-circuited.

7. The semiconductor memory device according to claim 1, wherein the filter length is made greater as the time required for a signal at an output node of the output buffer to change from high to low or low to high becomes shorter.

8. A semiconductor memory device comprising:
a memory cell array which includes a plurality of memory cells holding data;
an output buffer circuit which outputs data read from the memory cells;
an input buffer circuit which receives an address signal for the memory cells and includes a noise filter to remove noise; and
a register which controls a data output characteristic of the output buffer and a filter length of the noise filter on the basis of a control signal externally received.

9. The semiconductor memory device according to claim 8, wherein the output buffer circuit includes MOS transistors each of which is controlled independently and each of which supplies current to an output node of the output buffer circuit according to the data,
the control signal indicates a load on a circuit to which the output buffer is connected, and
the register not only increases the current driving power of the output buffer by increasing the number of MOS transistors to be turned on as the load becomes heavier, but also makes the filter length greater.

10. The semiconductor memory device according to claim 8, wherein the data read from the memory cells is multi-bit data,
the output buffer circuit includes a plurality of output circuits each of which outputs any one of the bits in the data,
the control signal indicates the number of bits in the read data,
as many of the output circuits as the number of bits are brought into an operating state, and
the register makes the filter length greater as the number of bits becomes larger.

11. The semiconductor memory device according to claim 8, wherein the output buffer circuit outputs the data in synchronization with a clock signal and includes MOS transistors each of which is controlled independently and each of which supplies current to an output node of the output buffer circuit according to the data, and,
the control signal indicates the frequency of the clock signal, and
the register not only increases the current driving power of the output buffer by increasing the number of MOS transistors to be turned on as the frequency becomes higher, but also makes the filter length greater.

12. The semiconductor memory device according to claim 8, wherein the noise filter includes a resistance element provided in a transmission path through which the address signal received is transmitted and a plurality of MOS transistors each of which has a source or a drain connected to the transmission path, and
the filter length is varied according to the number of MOS transistors to be turned on.

13. The semiconductor memory device according to claim 8, wherein the noise filter includes a plurality of resistance elements connected in series in a transmission path through which the address signal received is transmitted, and a MOS transistor having a source or a drain connected to the transmission path,
the MOS transistor short-circuits both ends of at least one of the resistance element, and
the filter length is varied according to the number of resistance elements both ends of which are short-circuited.

14. The semiconductor memory device according to claim 8, wherein the filter length is made greater as the time required for a signal at an output node of the output buffer to change from high to low or low to high becomes shorter.

15. A method of controlling a semiconductor memory device comprising:
accepting a first control signal input to the semiconductor memory device after the power supply of the semiconductor memory device has been turned on;
referring to a table which holds the relationship between the first control signal and the current driving power of a data output circuit and generating a second control signal which controls the data output circuit so as to produce the current driving power corresponding to the first control signal accepted;
determining the current driving power of the data output circuit according to the second control signal; and
on the basis of the second control signal, determining the filter length of a noise filter in an input buffer accepting an external input signal in such a manner that the filter length is set greater as the current driving power becomes higher.

16. The method according to claim 15, wherein the first control signal indicates a load on a circuit to which the data output signal is connected.

17. The method according to claim 15, wherein the first control signal indicates the number of bits in the data read from the semiconductor memory device.

18. The method according to claim 15, wherein the first control signal indicates the operating frequency of the semiconductor memory device.

* * * * *